United States Patent
Kao et al.

(10) Patent No.: US 12,266,728 B2
(45) Date of Patent: Apr. 1, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Wan-Yi Kao, Baoshan Township (TW); Yu-Cheng Shiau, Hsinchu (TW); Chunyao Wang, Zhubei (TW); Chih-Tang Peng, Zhubei (TW); Yung-Cheng Lu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/591,730

(22) Filed: Feb. 29, 2024

(65) Prior Publication Data

US 2024/0204104 A1 Jun. 20, 2024

Related U.S. Application Data

(63) Continuation of application No. 18/064,562, filed on Dec. 12, 2022, now Pat. No. 11,942,549, which is a (Continued)

(51) Int. Cl.
*H01L 29/78* (2006.01)
*H01L 21/02* (2006.01)
(Continued)

(52) U.S. Cl.
CPC ........ *H01L 29/785* (2013.01); *H01L 21/0214* (2013.01); *H01L 21/02211* (2013.01);
(Continued)

(58) Field of Classification Search
CPC ............... H01L 29/785; H01L 21/0214; H01L 21/02211; H01L 21/02263;
(Continued)

(56) References Cited

U.S. PATENT DOCUMENTS 8,563,373 B2 * 10/2013 Kim .................. H01L 29/66795
438/137
9,530,779 B2 12/2016 Lee
(Continued)

FOREIGN PATENT DOCUMENTS

DE 102017126435 A1 2/2019
KR 20190024567 A 3/2019
(Continued)

*Primary Examiner* — Earl N Taylor
(74) *Attorney, Agent, or Firm* — Slater Matsil, LLP

(57) ABSTRACT

A semiconductor device and method of manufacture are provided. In embodiments a first liner is deposited to line a recess between a first semiconductor fin and a second semiconductor fin, the first liner comprising a first material. The first liner is annealed to transform the first material to a second material. A second liner is deposited to line the recess, the second liner comprising a third material. The second liner is annealed to transform the third material to a fourth material.

20 Claims, 32 Drawing Sheets

Related U.S. Application Data continuation of application No. 17/157,330, filed on Jan. 25, 2021, now Pat. No. 11,527,653.

(60) Provisional application No. 63/055,045, filed on Jul. 22, 2020.

(51) Int. Cl.
  *H01L 21/762* (2006.01)
  *H01L 21/8234* (2006.01)
  *H01L 27/092* (2006.01)
  *H01L 29/51* (2006.01)
  *H01L 29/66* (2006.01)

(52) U.S. Cl.
  CPC .. *H01L 21/02263* (2013.01); *H01L 21/76224* (2013.01); *H01L 21/76232* (2013.01); *H01L 21/823481* (2013.01); *H01L 27/0924* (2013.01); *H01L 29/517* (2013.01); *H01L 29/66545* (2013.01); *H01L 29/66795* (2013.01); *H01L 29/66818* (2013.01); *H01L 21/76227* (2013.01)

(58) Field of Classification Search
  CPC ......... H01L 21/76224; H01L 21/76232; H01L 21/823481; H01L 21/823878; H01L 27/0924; H01L 29/517; H01L 29/66545; H01L 29/66795; H01L 29/66818; H01L 21/76227
  See application file for complete search history.

(56) References Cited

U.S. PATENT DOCUMENTS

| | | | |
|---|---|---|---|
| 10,748,808 B2 | 8/2020 | Lin et al. | |
| 10,790,198 B2 | 9/2020 | Al-Amoody et al. | |
| 10,957,585 B2* | 3/2021 | Hsu | H01L 21/76224 |
| 11,069,812 B2* | 7/2021 | Kao | H01L 29/66545 |
| 11,139,432 B1* | 10/2021 | Liu | H01L 21/823481 |
| 2007/0020855 A1* | 1/2007 | Kim | H01L 27/088 438/268 |
| 2009/0317967 A1* | 12/2009 | Kim | H01L 29/4238 438/589 |
| 2014/0103482 A1* | 4/2014 | Kim | H01L 29/7851 257/499 |
| 2015/0060861 A1 | 3/2015 | Chiu et al. | |
| 2017/0032969 A1* | 2/2017 | Shin | H01L 27/088 |
| 2017/0033199 A1* | 2/2017 | Wu | H01L 21/3115 |
| 2017/0178972 A1* | 6/2017 | Chang | H01L 21/02129 |
| 2018/0053821 A1* | 2/2018 | Mallela | H01L 29/785 |
| 2018/0342426 A1* | 11/2018 | Feng | H01L 21/823821 |
| 2019/0067027 A1* | 2/2019 | Wang | H01L 21/02211 |
| 2019/0103491 A1* | 4/2019 | Chan | H01L 29/7848 |
| 2019/0131186 A1* | 5/2019 | Chung | H01L 21/823821 |
| 2019/0157156 A1* | 5/2019 | Chen | H01L 21/76224 |
| 2019/0164848 A1* | 5/2019 | Chung | H01L 21/02252 |
| 2020/0006077 A1* | 1/2020 | Wang | H01L 21/76224 |
| 2020/0006148 A1* | 1/2020 | Chen | H01J 37/3211 |
| 2020/0105939 A1* | 4/2020 | Kao | H01L 29/66545 |
| 2020/0161170 A1* | 5/2020 | Kao | H01L 21/76224 |
| 2020/0212200 A1* | 7/2020 | Ghani | H01L 29/41783 |
| 2020/0343366 A1* | 10/2020 | Ghani | H01L 21/823807 |
| 2021/0265224 A1* | 8/2021 | Lin | H01L 21/823878 |
| 2021/0313514 A1* | 10/2021 | Liu | H01L 29/66795 |
| 2021/0376105 A1* | 12/2021 | Lin | H01L 29/41791 |
| 2021/0399221 A1* | 12/2021 | Liu | H10N 70/253 |
| 2021/0407847 A1* | 12/2021 | Chen | H01L 29/6656 |
| 2022/0029011 A1 | 1/2022 | Kao et al. | |

FOREIGN PATENT DOCUMENTS

| | | |
|---|---|---|
| KR | 20200008506 A | 1/2020 |
| KR | 20200060678 A | 6/2020 |
| KR | 20200060679 | 6/2020 |
| TW | 201428887 A | 7/2014 |
| TW | I629790 B | 7/2018 |
| TW | 202013509 A | 4/2020 |

* cited by examiner

SEMICONDUCTOR DEVICE AND METHOD OF MANUFACTURE

PRIORITY CLAIM AND CROSS-REFERENCE TO RELATED APPLICATIONS

This application is a continuation of Ser. No. 18/064,562, filed Dec. 12, 2022, entitled "Semiconductor Device and Method of Manufacture," which is a continuation of U.S. patent application Ser. No. 17/157,330, filed on Jan. 25, 2021, now U.S. Pat. No. 11,527,653, issued Dec. 13, 2022, entitled "Semiconductor Device and Method of Manufacture," which claims the benefit of U.S. Provisional Application No. 63/055,045, filed on Jul. 22, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
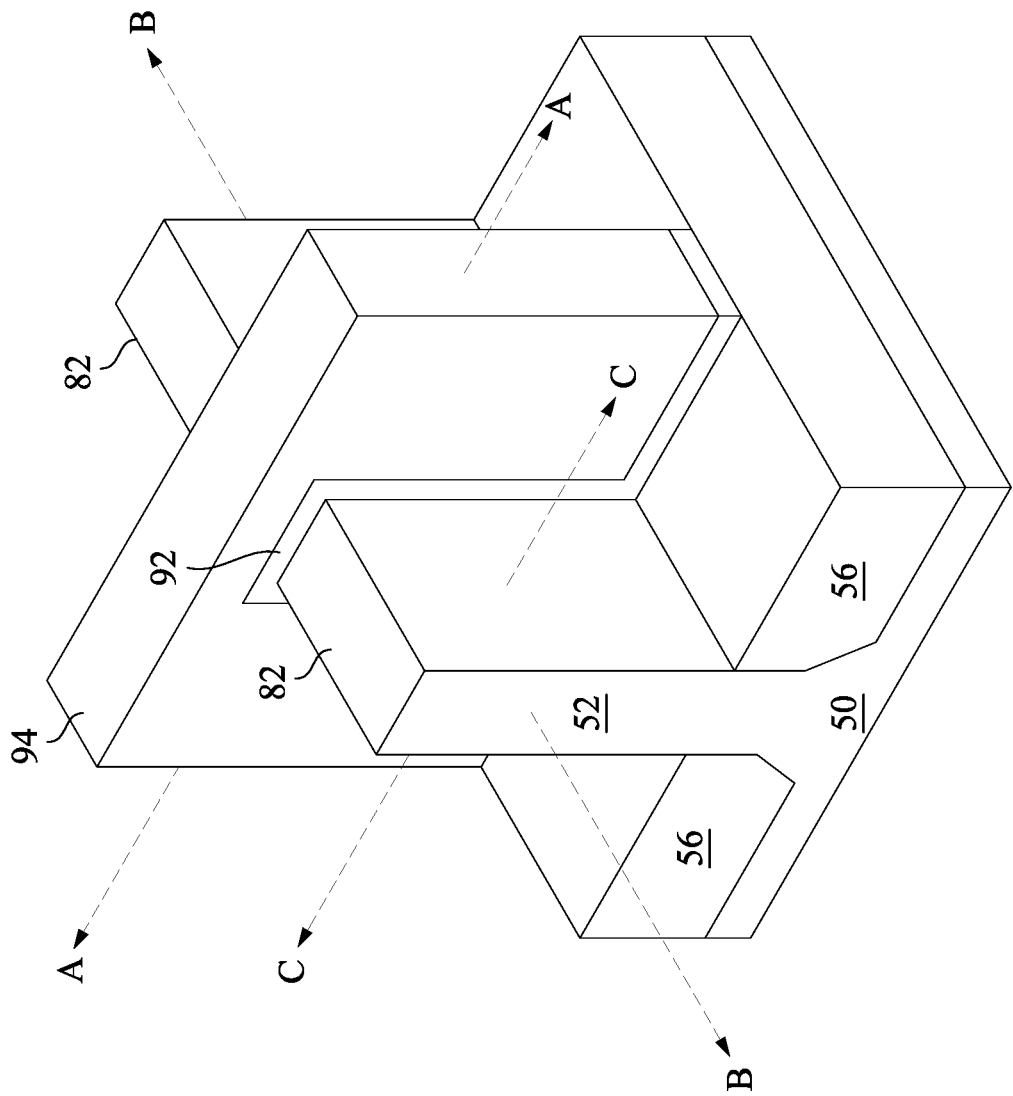
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which an isolation structure is formed with multiple layers. The embodiments describe herein, however, are not intended to be limited to the precise embodiments described, and the ideas may be implemented in a wide variety of uses. All such uses are fully intended to be included within the scope of the embodiments.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 22B are cross-sectional views of intermediate stages in the manufacturing of FinFETs, in accordance with some embodiments. FIGS. 2 through 13 illustrate reference cross-section A-A illustrated in FIG. 1, except for multiple fins/FinFETs. FIGS. 14A, 15A, 16A, 17A, 18A, 19A, 20A, 21A and 22A are illustrated along reference cross-section A-A illustrated in FIG. 1, and FIGS. 14B, 15B, 16B, 17B, 18B, 19B, 20B, 21B and 22B are illustrated along a similar cross-section B-B illustrated in FIG. 1, except for multiple fins/FinFETs. FIGS. 16C and 16D are illustrated along reference cross-section C-C illustrated in FIG. 1, except for multiple fins/FinFETs.

Figure 2:
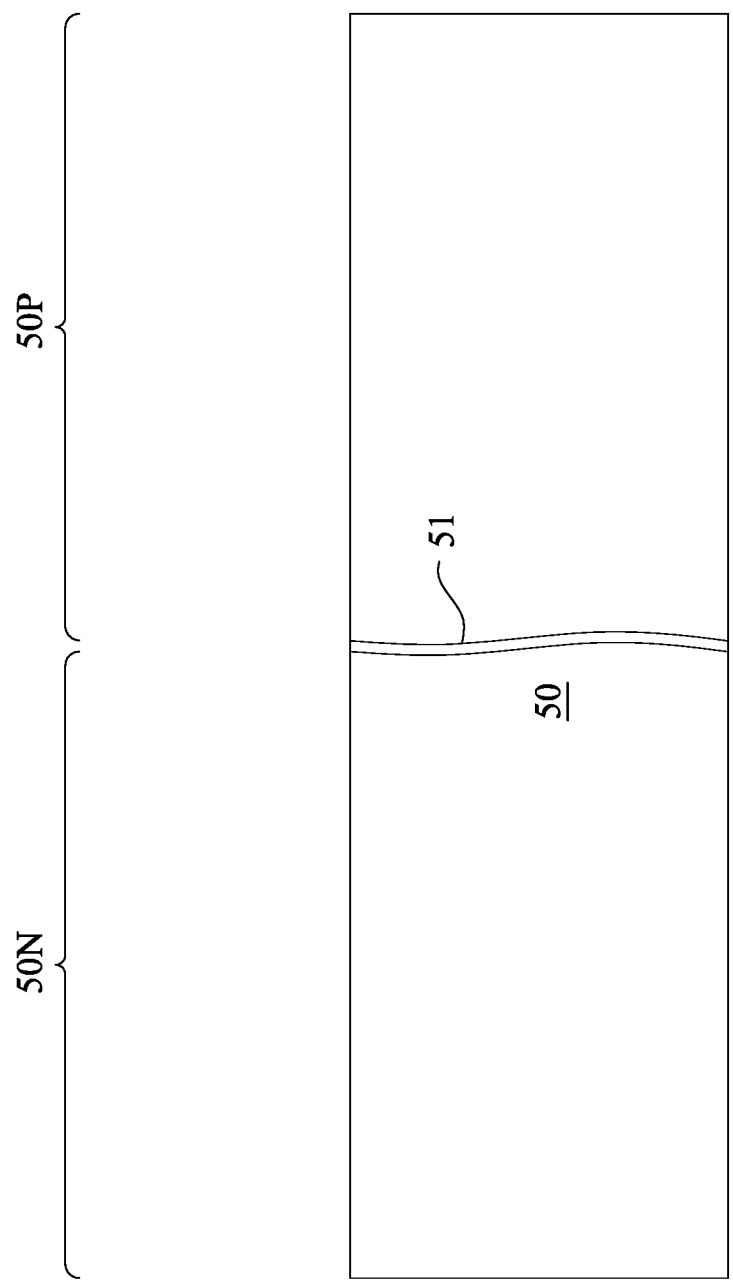
FIGS. 2, 3, 4, 5, 6A, 6B, 6C, 6D, 6E, 6F, 6G, 6H, 6I, 7, 8A, 8B, 8C, 8D, 8E, 8F, 8G, 9, 10, 11, 12, 13, 14A, 14B, 15A, 15B, 16A, 16B, 16C, 16D, 17A, 17B, 18A, 18B, 19A, 19B, 20A, 20B, 20C, 21A, 21B, 22A, 22B, 23A and 23B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon dioxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
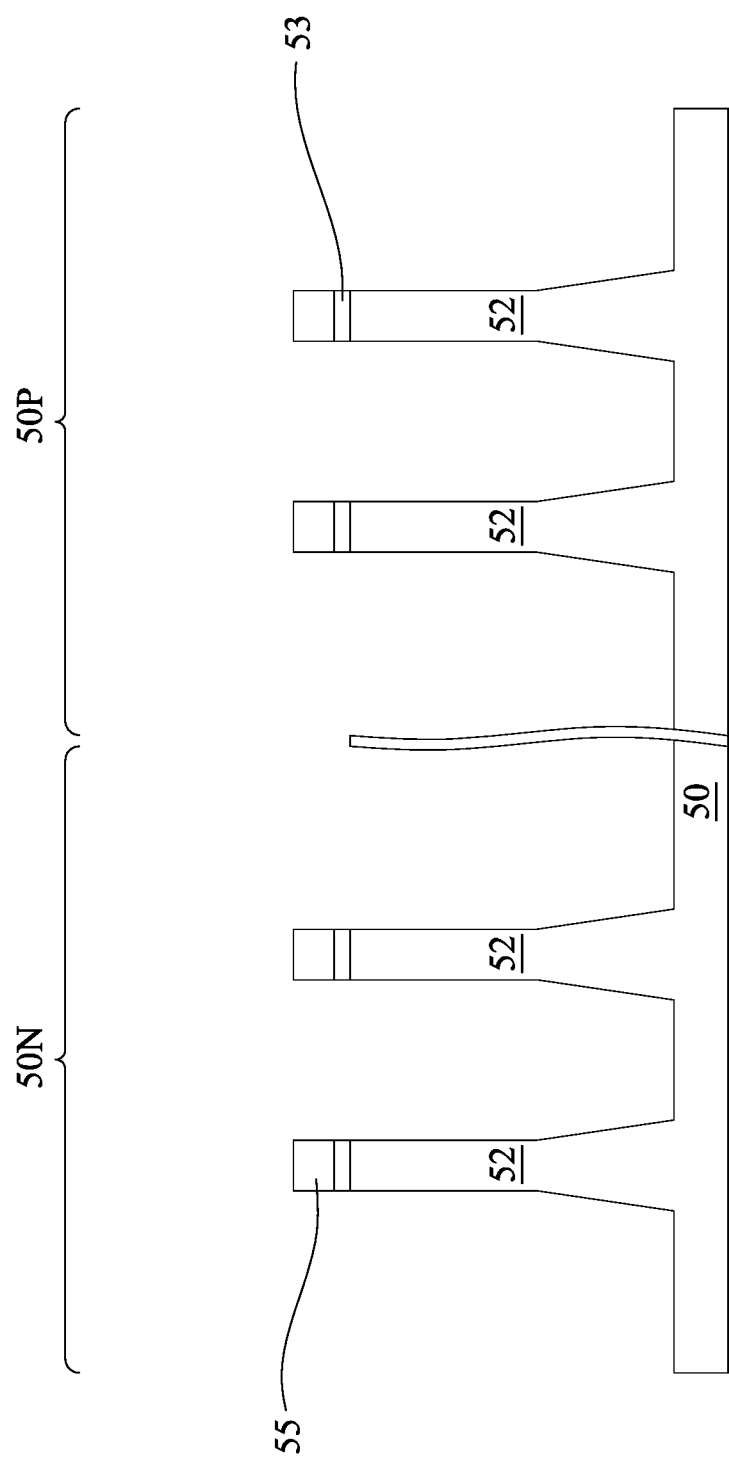

In FIG. 3, fins 52 are formed in the substrate 50. The fins 52 are semiconductor strips. In some embodiments, the fins 52 may be formed in the substrate 50 by first depositing a first mask layer 53 (e.g., silicon dioxide) and a second mask layer 55 (e.g., silicon nitride), patterning the first mask layer 53 and the second mask layer 55, and then using the first mask layer 53 and the second mask layer 55 to etch trenches in the substrate 50. The etching may be any acceptable etch process, such as a reactive ion etch (RIE), neutral beam etch (NBE), the like, or a combination thereof. The etch may be anisotropic.

However, the fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
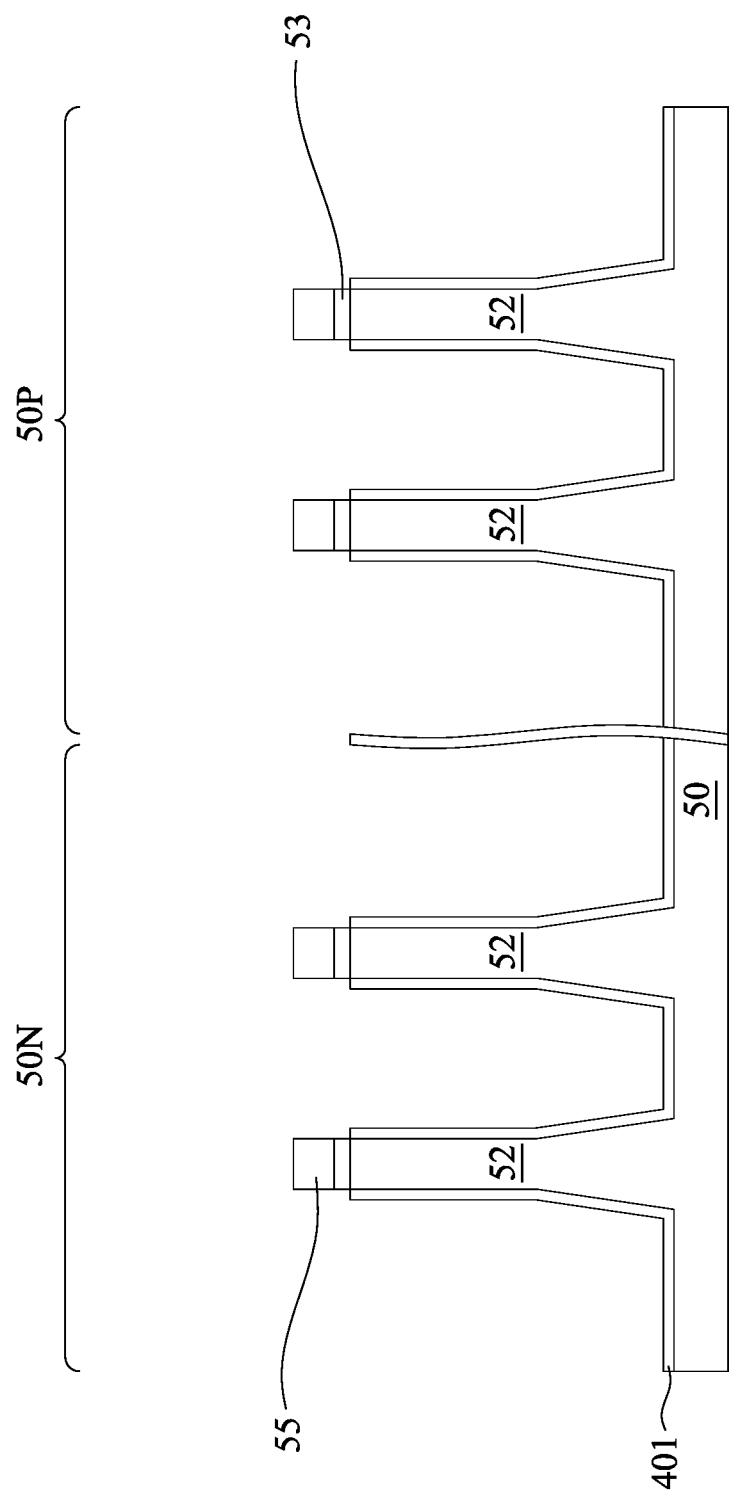

FIG. 4 illustrates a deposition of a first liner 401 over the fins 52 which is utilized to help block any oxidation of a channel region located within the fins 52. In an embodiment the first liner 401 may be a material such as silicon, silicon dioxide, or silicon nitride, deposited along the sidewalls of the fins 52 and, in some embodiments, not over the first mask layer 53 and the second mask layer 55, using a process such as epitaxial growth, chemical vapor deposition, atomic layer deposition, combinations of these, or the like. However, any suitable material and any suitable deposition process (e.g., a blanket deposition process) may be utilized.

Additionally, the first liner 401 may be formed to have a density of between about 2 $g/cm^3$ and about 4 $g/cm^3$ and to have a thickness of less than about 20 Å, such as about 13 Å. If the first liner 401 is formed to have a thickness that is greater than 20 Å, the device will be negatively impacted, while if the thickness is too thin (or if the first liner 401 is not present), there is an increased risk of oxidation of the channel region within the fin 52.

Figure 5:
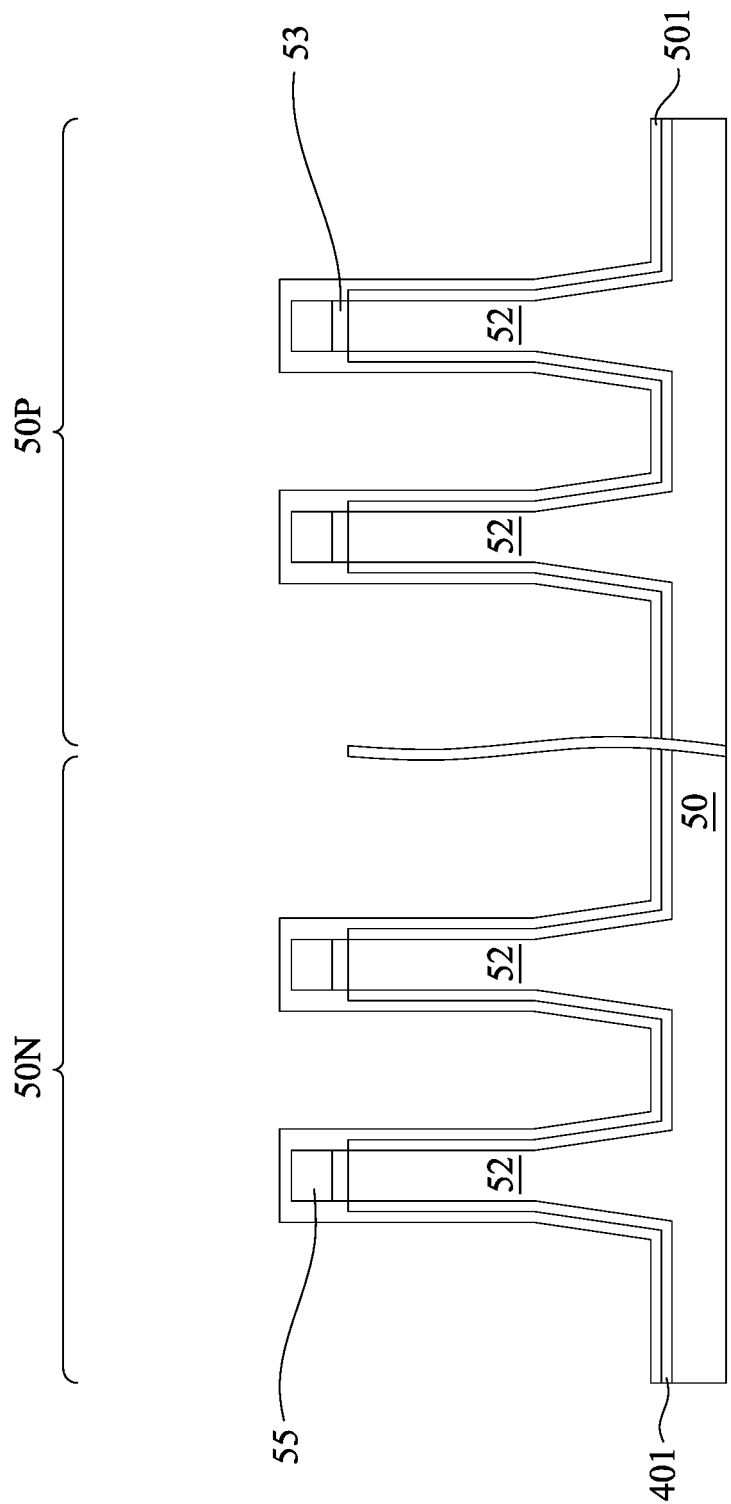

FIG. 5 illustrates a deposition of a second liner 501 over the first liner 401. In an embodiment the second liner 501 is utilized to help separate the fins 52 from subsequently deposited layers (described further below). As such, in some embodiments the second liner 501 may be a material such as silicon dioxide blanket deposited over the fins 52, the first mask layer 53 and the second mask layer 55, using a process such as chemical vapor deposition, atomic layer deposition, sputtering, combinations of these, or the like.

Additionally, the second liner 501 may be formed to have a density of between about 2 $g/cm^3$ and about 2.6 $g/cm^3$ and to have a thickness of between about 10 Å and about 50 Å, such as about 27.5 Å. If the second liner 501 is formed to have a thickness that is greater than 50 Å, excess oxidation may occur in surrounding structures (e.g., the fins 52), while if the thickness is less than about 10 Å, there is an increased risk of impact to the device.

Figure 6A:
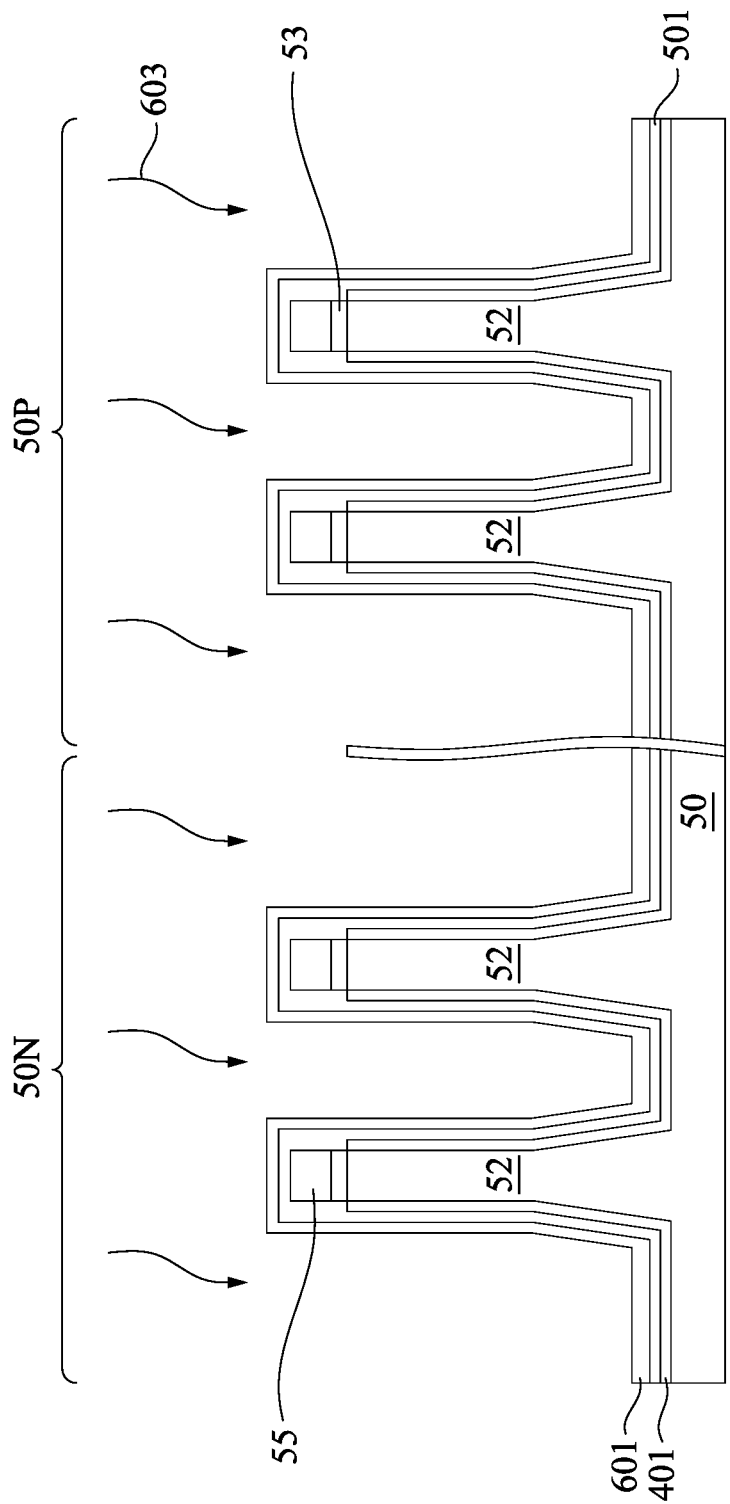
Figure 6B:
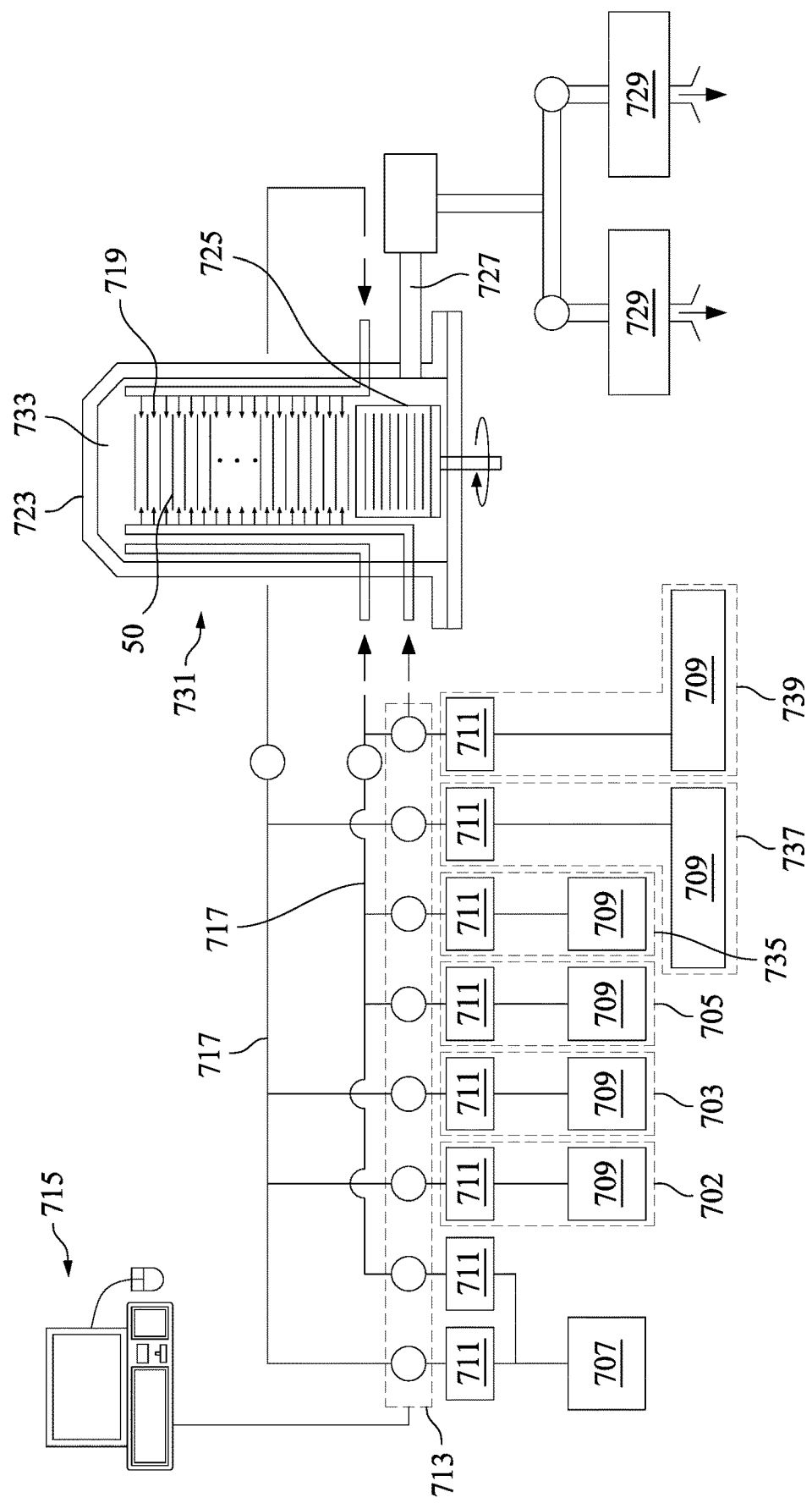

FIGS. 6A-6B illustrate a deposition of a third liner 601 over the second liner 501. In an embodiment the third liner 601 is a different material from the second liner 501 and which may also be transformed in a subsequent process (described further below). As such, the third liner 601 may be a material such as silicon oxynitride (SiON), SiOCN, SiN, combinations of these, or the like. However, any suitable material may be utilized.

FIG. 6B illustrates a deposition system 731 which may be utilized to receive precursor materials in order to help deposit the third liner 601. In an embodiment the deposition system 731 receives precursor materials from a plurality of precursor delivery systems, such as a first precursor delivery system 702, a second precursor delivery system 703, a third precursor delivery system 705, a fourth precursor delivery system 735, a fifth precursor delivery system 737, and a sixth precursor delivery system 739, and form layers of materials onto the substrate 50 within a deposition chamber 733.

In an embodiment the first precursor delivery system 702, the second precursor delivery system 703, the third precursor delivery system 705, the fourth precursor delivery system 735, the fifth precursor delivery system 737, and the sixth precursor delivery system 739 may work in conjunction with one another to supply the one or more different precursor materials to the deposition chamber 733 wherein one or more of the substrates 50 are placed. However, the first precursor delivery system 702, the second precursor delivery system 703, the third precursor delivery system 705, the fourth precursor delivery system 735, the fifth precursor delivery system 737, and the sixth precursor delivery system 739 may have physical components that are similar with each other. For example, the first precursor delivery system 702, the second precursor delivery system 703, the third precursor delivery system 705, the fourth precursor delivery system 735, the fifth precursor delivery system 737, and the sixth precursor delivery system 739 may each include a gas supply 709 and a flow controller 711. In an embodiment in which the first precursor is stored in a gaseous state, the gas supply 709 may supply the first precursor to the deposition chamber 733. The gas supply 709 may be a vessel, such as a gas storage tank, that is located either locally to the deposition chamber 733 or else may be located remotely from the deposition chamber 733. Alternatively, the gas supply 709 may be a facility that independently prepares and delivers the first precursor to the flow controller 711. Any suitable source for the first precursor may be utilized as the gas supply 709, and all such sources are fully intended to be included within the scope of the embodiments.

The gas supply 709 may supply the desired precursor to the flow controller 711. The flow controller 711 may be utilized to control the flow of the precursor to one or more precursor gas controllers 713 and, eventually, to the deposition chamber 733, thereby also helping to control the pressure within the deposition chamber 733. The flow controller 711 may be, e.g., a proportional valve, a modulating valve, a needle valve, a pressure regulator, a mass flow controller, combinations of these, or the like. However, any suitable method for controlling and regulating the flow of the first precursor may be utilized, and all such components and methods are fully intended to be included within the scope of the embodiments.

Additionally, in an embodiment in which the first precursor is stored in a solid or liquid state, the gas supply 709 may store a carrier gas and the carrier gas may be introduced into a precursor canister or vaporizer, which stores the first precursor in the solid or liquid state. The carrier gas is then used to push and carry the first precursor as it either evaporates or sublimates into a gaseous section of the precursor canister before being sent to the precursor gas controller 713. Any suitable method and combination of units may be utilized to provide the first precursor, and all such combination of units is fully intended to be included within the scope of the embodiments.

The first precursor delivery system 702, the second precursor delivery system 703, the third precursor delivery system 705, the fourth precursor delivery system 735, the fifth precursor delivery system 737, and the sixth precursor delivery system 739 may supply their individual precursor materials into one or more of a series of precursor gas controllers 713. The precursor gas controllers 713 connect and isolate the first precursor delivery system 702, the second precursor delivery system 703, the third precursor delivery system 705, the fourth precursor delivery system 735, the fifth precursor delivery system 737, and the sixth precursor delivery system 739 from the deposition chamber 733 in order to deliver the desired precursor materials to the deposition chamber 733. The precursor gas controller 713 may include such devices as valves, flow meters, sensors, and the like to control the delivery rates of each of the precursors and may be controlled by instructions received from a control unit 715.

The precursor gas controllers 713, upon receiving instructions from the control unit 715, may open and close valves so as to connect one or more of the first precursor delivery system 702, the second precursor delivery system 703, the third precursor delivery system 705, the fourth precursor delivery system 735, the fifth precursor delivery system 737, and the sixth precursor delivery system 739 to the deposition chamber 733 and direct a desired precursor material through one or more manifolds 717, into the deposition chamber 733, and to one or more injection units 719. The injection units 719 may be utilized to disperse the chosen precursor material(s) into the deposition chamber 733 and may be designed to evenly disperse the precursor material in order to minimize undesired process conditions that may arise from uneven dispersal. In a particular embodiment the injection units 719 may be formed, for example, from coiled tubing including a plurality of holes distributed throughout the tubing allowing for uniform dispersal of the precursor material in the deposition chamber 733. However, any suitable shape may be utilized.

However, as one of ordinary skill in the art will recognize, the introduction of precursor materials to the deposition chamber 733 through a single unit as described above is intended to be illustrative only and is not intended to be limiting to the embodiments. Any number of separate and independent injectors, such as three separate and independent injectors, or other openings to introduce precursor materials into the deposition chamber 733 may be utilized. All such combinations and other points of introduction are fully intended to be included within the scope of the embodiments.

The deposition chamber 733 may receive the desired precursor materials and expose the precursor materials to the substrates 50, and the deposition chamber 733 may be any desired shape that may be suitable for dispersing the precursor materials and contacting the precursor materials with the substrates 50. In the embodiment illustrated in FIG. 6B, the deposition chamber 733 has a cylindrical sidewall and a bottom. However, the deposition chamber 733 is not limited to a cylindrical shape, and any other suitable shape, such as a hollow square tube, an octagonal shape, or the like, may be utilized. Furthermore, the deposition chamber 733 may be surrounded by a housing 723 made of material that is inert to the various process materials. As such, while the housing 723 may be any suitable material that can withstand the chemistries and pressures involved in the deposition process, in an embodiment the housing 723 may be steel, stainless steel, nickel, aluminum, alloys of these, combinations of these, or the like.

Within the deposition chamber 733 a plurality of the substrates 50 may be placed within a rack on a mounting rack 725 in order to position and control the substrates 50 during the deposition processes. The mounting rack 725 may include heating mechanisms in order to heat the substrates 50 during the deposition processes as well as rotation mechanisms in order to rotate the substrates 50 during the deposition process. Furthermore, while a mounting rack 725 is illustrated in FIG. 6B, a single mounting platform for supporting a single wafer may be included within the deposition chamber 733.

In addition, the deposition chamber 733 may include heating elements and/or heating lamps configured to control the temperatures of precursor gases (e.g., the first precursor) entering the deposition chamber 733 and the exhaust gases exiting the deposition chamber 733. According to embodiments, as the precursors enter the manifold 717 the heating elements either maintain or else raise the temperature of the precursors to a process temperature above a boiling point of the precursors to ensure that the precursor remains in a gas-phase and maintain a suitable flow rate of the precursors at the injection unit 719. Furthermore, as the exhaust gases are evacuated from the deposition chamber 733, the heating elements maintain or raise the temperature of the exhaust gases at the exhaust outlet 727 to a temperature above a boiling point of the exhaust gases to maintain a suitable evacuation rate of the exhaust.

The deposition chamber 733 further comprises cooling elements and a coolant source, according to some embodiments. The cooling elements are located within the housing 723 adjacent the injection unit 719 and the mounting rack 725. The control unit 715 controls the valve at the coolant source to release coolant into the cooling elements. As such, the temperatures of the precursor gases are controlled to a desired process temperature as they exit the injection unit 719 and at the locations of the substrates 50 during the deposition process.

One or more vacuum pumps 729 (e.g., two vacuum pumps 729, with different vacuum pumps being utilized to remove different precursors) may be connected to an exhaust outlet 727 of the deposition chamber 733 in order to help evacuate the exhaust gases. The exhaust outlet 727, under control of the control unit 715, may also be utilized to reduce and control the pressure within the deposition chamber 733 to a desired pressure and may also be utilized to evacuate precursor materials from the deposition chamber 733 in preparation for the introduction of the next precursor material.

The control unit 715 may be utilized to control the precursor gas controller 713, the vacuum pump 729, the heating elements, the coolant source, and/or the cooling elements. The control unit 715 may be any form of computer processor that can be used in an industrial setting for controlling process machines. In an embodiment the control unit 715 may comprise a processing unit, such as a desktop computer, a workstation, a laptop computer, or a dedicated unit customized for a particular application. The control unit 715 may be equipped with a display and one or more input/output components, such as instruction outputs, sensor inputs, a mouse, a keyboard, printer, combinations of these, or the like. The processing unit may include a central processing unit (CPU), memory, a mass storage device, a video adapter, an I/O interface, and/or a network interface connected to a bus.

The bus may be one or more of any type of several bus architectures including a memory bus or memory controller, a peripheral bus, or video bus. The CPU may comprise any type of electronic data processor, and the memory may comprise any type of system memory, such as static random access memory (SRAM), dynamic random access memory (DRAM), or read-only memory (ROM). The mass storage device may comprise any type of storage device configured to store data, programs, and other information and to make the data, programs, and other information accessible via the bus. The mass storage device may comprise, for example, one or more of a hard disk drive, a magnetic disk drive, or an optical disk drive.

The video adapter and the I/O interface provide interfaces to couple external input and output devices to the processing unit. Examples of input and output devices include, but are not limited to, the display coupled to the video adapter and the I/O component, such as a mouse, keyboard, printer, and the like, coupled to the I/O interface. Other devices may be coupled to the processing unit and additional or fewer interface cards may be utilized. For example, a serial interface card (not shown) may be used to provide a serial interface for a printer.

The network interface couples the processing unit to external networks to facilitate network communications and to provide network access to external resources via one or more wired and/or wireless links (e.g., local area network (LAN) and/or wide area network (WAN)). The network access and network communications may use one or more circuit switched networks and/or packet switched networks.

In an embodiment the control unit 715 may be a system that is locally connected via one or more wired and/or wireless connections to the precursor gas controllers 713 and/or the vacuum pumps 729. In another embodiment the control unit 715 may be a system that is remote from the precursor gas controller 713 and/or the vacuum pump 729, and may connect and control the precursor gas controller 713 and vacuum pump 729 via a remote wired and/or wireless connection. In an embodiment, the control unit 715 may be a distributed system comprising one or more processing units of one or more network servers and/or may employ one or more network services for controlling the precursor gas controller 713 and/or the vacuum pump 729.

It should be noted that the control unit 715 may include other components. For example, the control unit 715 may include power supplies, cables, a motherboard, removable storage media, cases, and the like. These other components, although not shown in FIG. 6B, are considered part of the control unit 715.

To begin the deposition process for the third liner 601, a first precursor material may be placed into one or more of the first precursor delivery system 702, the second precursor delivery system 703, and/or the third precursor delivery system 705. In an embodiment in which the third liner 601 is silicon oxynitride (SiON), the first precursor material may be a silicon comprising precursor such as hexachlorodisilane (HCD), dichlorosilane (DCS), MS, combinations of these, or the like. However, any suitable precursor for any suitable material may be utilized.

A second precursor material may be placed into another one of the first precursor delivery system 702, the second precursor delivery system 703, and/or the third precursor delivery system 705. In the embodiment in which the third liner 601 is silicon oxynitride (SiON) and the first precursor material is hexachlorodisilane, the second precursor material may be an oxygen comprising precursor such as oxygen ($O_2$), $H_2O$, $O_3$, combinations of these, or the like. However, any suitable precursor for any suitable material may be utilized.

A third precursor material may be placed into yet another one of the first precursor delivery system 702, the second precursor delivery system 703, and/or the third precursor delivery system 705. In the embodiment in which the third liner 601 is silicon oxynitride (SiON), the first precursor material is hexachlorodisilane, and the second precursor material is oxygen, the third precursor material may be a nitrogen containing precursor such as ammonia ($NH_3$), diazene ($N_2H_2$), nitrogen ($N_2$), combinations of these, or the like. However, any suitable precursor for any suitable material may be utilized.

Once the first precursor material, the second precursor material, and the third precursor material have been placed into the first precursor delivery system 702, the second precursor delivery system 703, and the third precursor delivery system 705, respectively, the formation of the third liner 601 may be initiated by placing one or more of the substrates 50 (e.g., 100 substrates 50) into the mounting rack 725 (e.g., a wafer boat) and then raising the mounting rack 725 into the deposition chamber 733.

Once the mounting rack 725 has been placed, a pressure within the deposition chamber 733 may be adjusted to the desired process pressures. In an embodiment the pressure may be adjusted to be between about 931 Pa and about 5000 Pa, such as about 4660 Pa. Additionally, the temperature within the deposition chamber 733 may be ramped up to the desired process temperature, such as ramping the temperature to the desired process temperature of between about 500° C. and about 750° C., such as about 550° C. In a very particular embodiment the process temperature may be ramped up from a temperature of about 450° C. to a process temperature of about 550° C. or about 630° C. However, any suitable process conditions may be utilized.

Then, after a vacuum check (VC) and a leak check, the atomic layer deposition cycle may be initiated by the control unit 715 sending an instruction to the precursor gas controller 713 to connect the first precursor delivery system 702 to the deposition chamber 733. Once connected, the first precursor delivery system 702 can deliver the first precursor material to the injection unit 719 through the precursor gas controller 713 and the manifold 717. The injection unit 719 can then disperse the first precursor material into the deposition chamber 733, wherein the first precursor material can be adsorbed and react with each of the exposed surfaces.

In one embodiment in which the third liner 601 is silicon oxynitride, the first precursor material (e.g., hexachlorodisilane) may be flowed into the deposition chamber 733 at a flow rate of between about 0.2 slm and about 6 slm, such as about 0.45 slm, and a flow pressure of between about 10 Pa and about 300 Pa, such as about 110 Pa, for a time of between about 3 seconds and about 80 seconds, such as about 20 seconds. However, any suitable flow rate may be utilized.

Figure 6C:
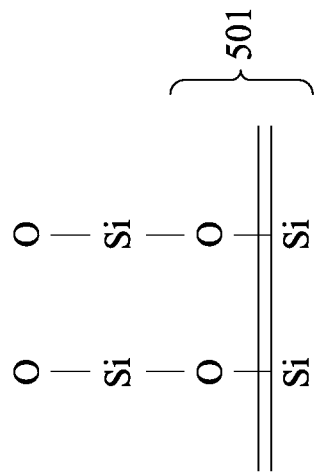

FIG. 6C illustrates a close-up view of a surface of the second liner 501 and illustrates that, in the embodiment in which a layer of silicon oxynitride is desired to be formed using hexachlorodisilane, under these process conditions the hexachlorodisilane will react with the exposed surfaces (e.g., the second liner 501) in order to provide a surface wherein silicon is chemically bonded to the underlying surface while the opposite surface is terminated with chlorine atoms which are exposed to the ambient atmosphere within the deposition chamber 733. Additionally, the reaction of the hexachlorodisilane with the underlying structures will be self-limiting, providing a single layer of molecules once this step is completed.

After the self-limiting reaction has finished, the deposition chamber 733 may be purged off the first precursor material with a first purge process. For example, the control unit 715 may instruct the precursor gas controller 713 to disconnect the first precursor delivery system 702 (containing the first precursor material to be purged from the deposition chamber 733) and to connect a purge gas delivery system 707 to deliver a purge gas to the deposition chamber 733. In an embodiment the purge gas delivery system 707 may be a gaseous tank or other facility that provides a purge gas such as nitrogen, argon, xenon, or other gas to the deposition chamber 733, for a purge flow pressure of about 66 Pa for a time period of about 13 seconds. Additionally, the control unit 715 may also initiate the vacuum pump 729 in order to apply a pressure differential to the deposition chamber 733 to aid in the removal of the first precursor material. The purge gas, along with the vacuum pump 729, may purge the first precursor material from the deposition chamber 733.

After the purge of the first precursor material has been completed, the introduction of the second precursor material (e.g., oxygen) to the deposition chamber 733 may be initiated by the control unit 715 sending an instruction to the precursor gas controller 713 to disconnect the purge gas delivery system 707 and to connect the second precursor delivery system 703 (containing the second precursor material) to the deposition chamber 733. Once connected, the second precursor delivery system 703 can deliver the second precursor material to the injection unit 719. The injection unit 719 can then disperse the second precursor material into the deposition chamber 733.

In the embodiment discussed above to form a layer of silicon oxynitride with hexachlorodisilane as the first precursor material and oxygen as the second precursor material, the second precursor material may be introduced into the deposition chamber 733 at a flow rate of between about 0.2 slm and about 8 slm, such as about 5 slm, with a flow pressure of between about 200 Pa and about 4500 Pa, such as about 1200 Pa, for at time of between about 3 seconds and about 120 seconds, such as about 59 seconds. However, as one of ordinary skill in the art will recognize, these flow rates are only intended to be illustrative, as any suitable process conditions may be utilized while remaining within the scope of the embodiments.

Figure 6D:
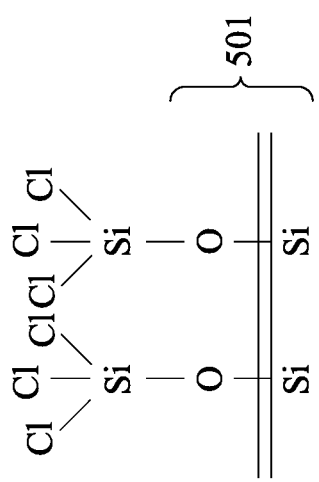

FIG. 6D illustrates a close-up view of the surface of the second liner 501 and illustrates that, in the embodiment in which a layer of silicon oxynitride is desired to be formed using hexachlorodisilane as the first precursor material and oxygen as the second precursor material, under these process conditions the oxygen will react with the exposed surfaces (e.g., the product of the reaction of the first precursor material) in order to provide a surface wherein oxygen is chemically bonded to the underlying surface (e.g., silicon).

After the reaction of the second precursor material has finished, the deposition chamber 733 may be purged off the second precursor material with a second purge process. For example, the control unit 715 may instruct the precursor gas controller 713 to disconnect the second precursor delivery system 703 (containing the second precursor material to be purged from the deposition chamber 733) and to connect the purge gas delivery system 707 to deliver the purge gas to the deposition chamber 733. In an embodiment the purge gas delivery system 707 may deliver the purge gas at a flow pressure of about 66 Pa for a time period of about 12 seconds. Additionally, the control unit 715 may also initiate the vacuum pump 729 in order to apply a pressure differential to the deposition chamber 733 to aid in the removal of the second precursor material. The purge gas, along with the vacuum pump 729, may purge the second precursor material from the deposition chamber 733.

After the purge of the second precursor material has been completed, the introduction of the third precursor material (e.g., ammonia) to the deposition chamber 733 may be initiated by the control unit 715 sending an instruction to the precursor gas controller 713 to disconnect the purge gas delivery system 707 and to connect the third precursor delivery system 705 (containing the third precursor material) to the deposition chamber 733. Once connected, the third precursor delivery system 705 can deliver the third precursor material to the injection unit 719. The injection unit 719 can then disperse the third precursor material into the deposition chamber 733.

In the embodiment discussed above to form a layer of silicon oxynitride with hexachlorodisilane as the first precursor material, oxygen as the second precursor material, and ammonia as the third precursor material, the third precursor material may be introduced into the deposition chamber 733 at a flow rate of between about 0.2 slm and about 8 slm, such as about 4.5 slm, with a flow pressure of between about 10 Pa and about 1500 Pa, such as about 931 Pa, for a time period of between about 2 seconds and about 80 seconds, such as about 18 seconds. However, as one of ordinary skill in the art will recognize, these flow rates are only intended to be illustrative, as any suitable process conditions may be utilized while remaining within the scope of the embodiments.

After the reaction of the third precursor material has finished, the deposition chamber 733 may be purged off the third precursor material with a third purge process. For example, the control unit 715 may instruct the precursor gas controller 713 to disconnect the third precursor delivery system 705 (containing the third precursor material to be purged from the deposition chamber 733) and to connect the purge gas delivery system 707 to deliver the purge gas to the deposition chamber 733. In an embodiment the purge gas delivery system 707 may deliver the purge gas at a flow pressure of about 66 Pa for a time period of about 3 seconds. Additionally, the control unit 715 may also initiate the vacuum pump 729 in order to apply a pressure differential to the deposition chamber 733 to aid in the removal of the third precursor material. The purge gas, along with the vacuum pump 729, may purge the third precursor material from the deposition chamber 733.

After the deposition chamber 733 has been purged using the third purge process, a first cycle for the formation of the third liner 601 has been completed, and a second cycle similar to the first cycle may be started. For example, the repeated cycle may introduce the first precursor material, purge with the purge gas, pulse with the second precursor material, purge with the purge gas, pulse with the third precursor material, and purge with the purge gas.

Each cycle of the first precursor material, the second precursor material, and the third precursor material can deposit another layer of the desired material for the third liner 601 (e.g., SiON) at a rate of about 2 Å per cycle. Additionally, each cycle also resets the exposed surface so that the exposed surface is prepared to receive the next cycle of the first precursor material, the second precursor material, and the third precursor material. These cycles may be repeated between about 5 times and about 100 times to form the third liner 601 to a thickness of between about 10 Å and about 50 Å, such as about 40 Å.

Once the depositions cycles have been finished, a removal process may be performed to remove the substrates 50 from the deposition system 731. In one embodiment the removal process may include a gas line purge, a post purge (using, e.g., the third precursor material of ammonia), a ramp down of the temperature from, e.g., 550° C. to about 450° C. or about 400° C., and a back filling of the ambient within the deposition chamber to ambient atmosphere. Once this has been performed, the substrates 50 may be removed from the deposition systems 731.

Figure 6E:
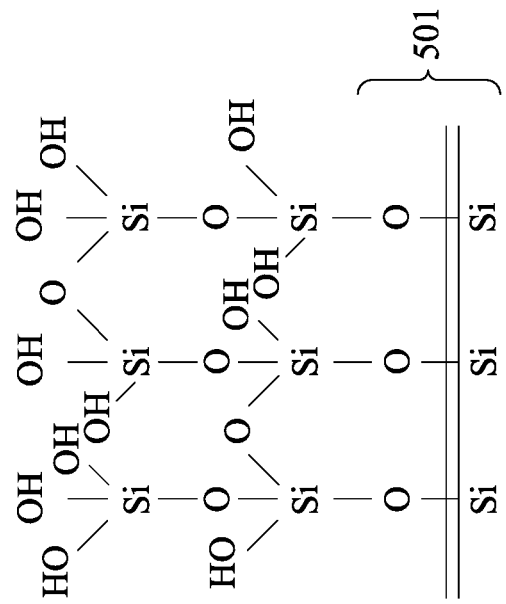

FIG. 6E illustrates a close up view of the surface of the second liner 501 and illustrates that, in the embodiment in which a layer of silicon oxynitride is desired to be formed using hexachlorodisilane as the first precursor material, oxygen as the second precursor material, and ammonia as the third precursor material, under these process conditions, multiple monolayers of the desired material (e.g., SiON) can be built up to cover the surface of the second liner 501.

By utilizing the process as described above, the third liner 601 may be formed with a desired first composition. For example, using the times and temperatures as described above, the third liner 601 may be formed with a nitrogen composition of greater than 0% and less than 10%. If the nitrogen concentration is greater than about 10%, there will be a negative impact to the device. Additionally, the third liner 601 may be formed with a silicon composition of between about 25%-atomic and about 40%-atomic, and an oxygen concentration of between about 40%-atomic and about 70%-atomic. Additionally, the third liner 601 may be formed with a density of between about 2 g/cm$^3$ and about 3 g/cm$^3$. However, any suitable compositions may be utilized.

FIG. 6A additionally illustrates a first annealing process (represented in FIG. 6A by the wavy lines labeled 603) which may be utilized after deposition of the third liner 601 in order to remove some of or all of the nitrogen (although the third liner 601 may still have a nitrogen concentration of between greater than 0% and less than 10%) and transform the material of the third liner 601. In an embodiment the first annealing process 603 may comprise a multi-step anneal which includes a first wet annealing process, a second wet annealing process, and a dry annealing process. For example, the first wet annealing process may be an anneal wherein the third liner 601 is heated in a moisture containing environment (e.g., water environment) at a temperature of between about 300° C. and about 500° C. for a time of between about 0.5 hours and about 2 hours. However, any suitable process parameters may be utilized.

During the first wet annealing process, the moisture in the environment will penetrate into the deposited material of the third liner 601 (e.g., the SiON) and react with the material of the third liner 601. For example, in an embodiment in which the third liner 601 is SiON, the moisture will react to replace some of the nitrogen groups within the material of the third liner 601 with hydroxyl groups. As such, a transformation of the third liner 601 to another material (e.g., silicon dioxide) may be begun.

Once the first wet annealing process has been completed, the transformation may be continued using a second wet annealing process. In an embodiment the second wet annealing process may be an anneal wherein the third liner 601 is heated in a moisture containing environment (e.g., water environment) at a temperature greater than the first wet annealing process, such as a temperature of between about 500° C. and about 650° C. for a time of between about 0.5 hours and about 4 hours. By utilizing a second wet annealing process, at a higher temperature, a fuller conversion of the material of the third liner 601 can be achieved. However, any suitable process parameters may be utilized.

Figure 6F:
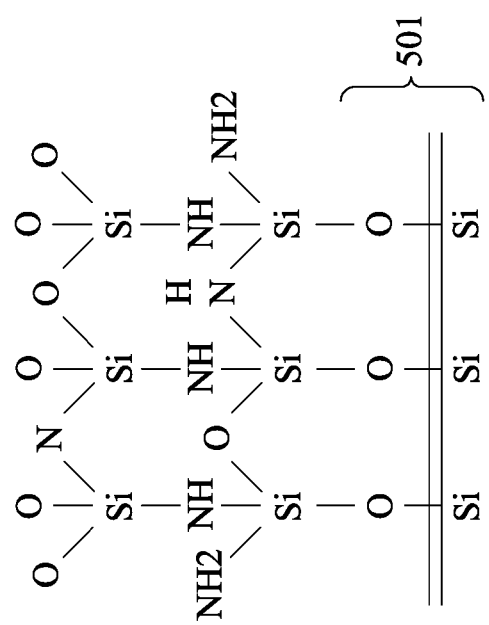

FIG. 6F illustrates a result of the first wet annealing process and the second wet annealing process. As can be seen, in the embodiments described above the original material of the third liner 601 (e.g., SiON) is reacted with water to remove at least some of the nitrogen. However, hydroxyl groups are still located within the material of the third liner 601.

As such, once the second wet annealing process has been completed, the first dry annealing process may be utilized in order to remove any excess moisture from the structure and to remove the hydroxyl groups. In an embodiment the first dry annealing process may be an anneal wherein the material of the third liner 601 is heated in a dry environment at a temperature of between about 600° C. and about 750° C. for a time of between about 0.5 hours and about 2 hours. However, any suitable process parameters may be utilized.

Figure 6G:
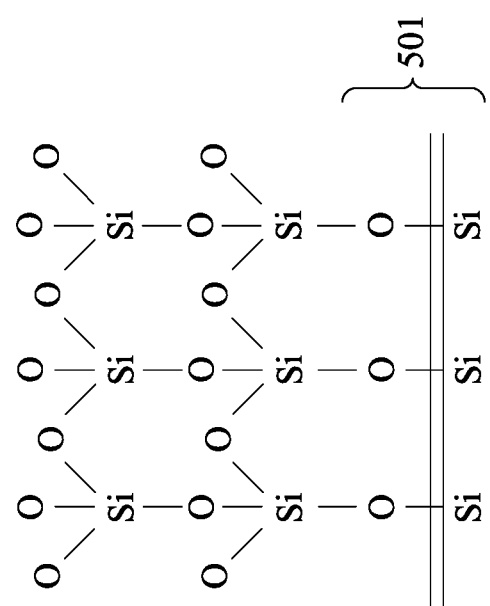

FIG. 6G illustrates a result of the first dry annealing process. In particular, in the first wet annealing process the moisture in the environment will penetrate into the deposited material of the third liner 601 (e.g., the SiON) and react to replace some of the nitrogen groups within the material of the third liner 601 with hydroxyl groups. In the first dry annealing process the increased temperature causes the hydroxyl groups to decompose, leaving behind silicon dioxide as the final material of the third liner 601.

Figure 6H:
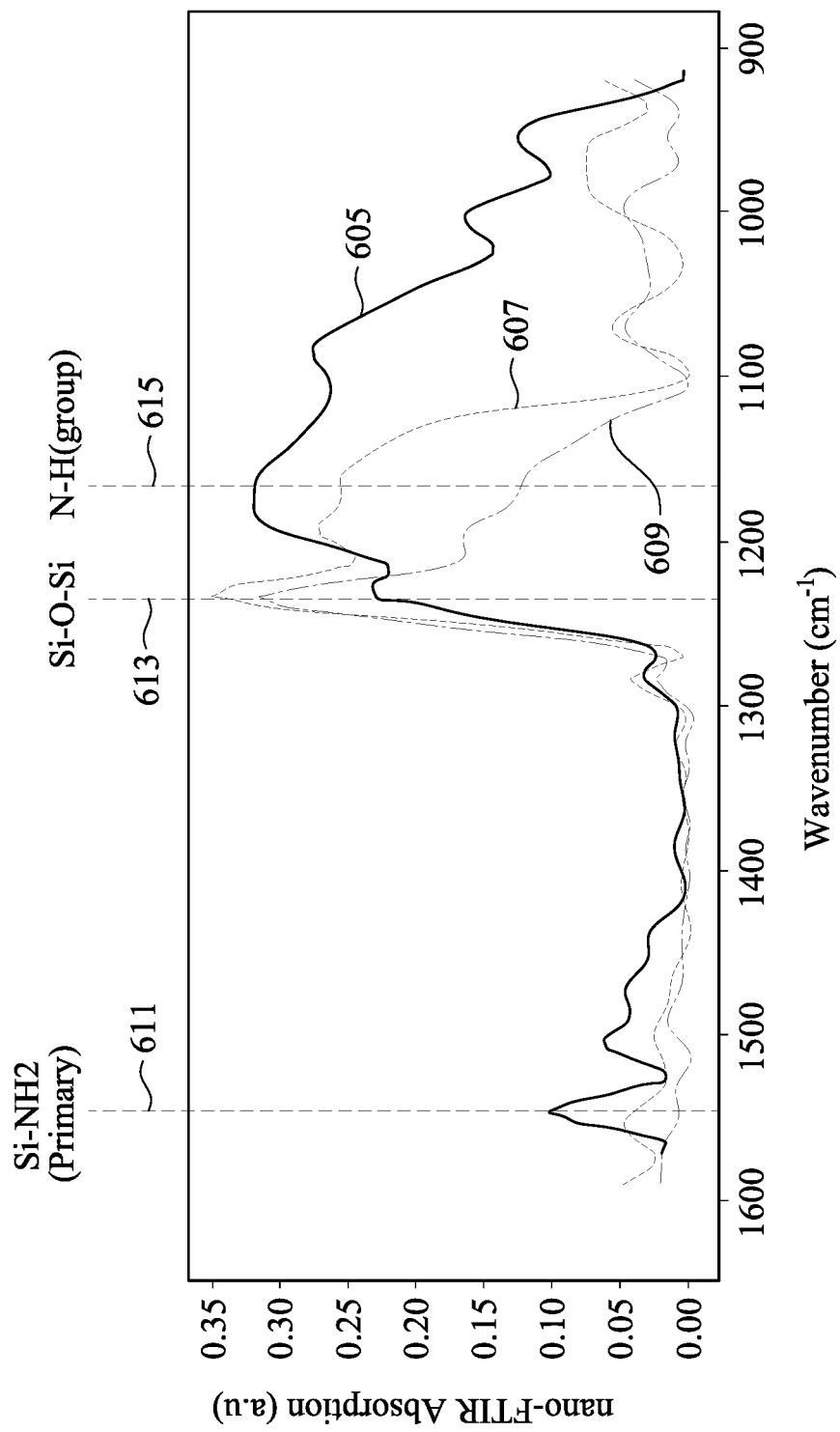

FIG. 6H illustrates a composition of the material of the third liner 601 as deposited (represented by the line labeled 605) at a temperature of 550° C., the material of the third liner 601 after the first wet annealing process (represented by the line labeled 607) and before the second wet annealing process, and the material of the third liner 601 after the first dry annealing process (represented by the line labeled 609). Additionally illustrated in FIG. 6H, are a first line 611 which illustrates the location of Si—$NH_2$ bonds, a second line 613 which illustrates the location of Si—O—Si bonds, and a third line 615 which illustrates the location of N—H bonds. As can be seen, the number of nitrogen bonds decreases from the as deposited composition through the first wet annealing process, to after the first dry annealing process. Similarly, the number of silicon to oxygen bonds increases from the as deposited composition through the first wet annealing process, to after the first dry annealing process. As such, the transformation of the material of the third liner 601 is achieved.

Figure 6I:
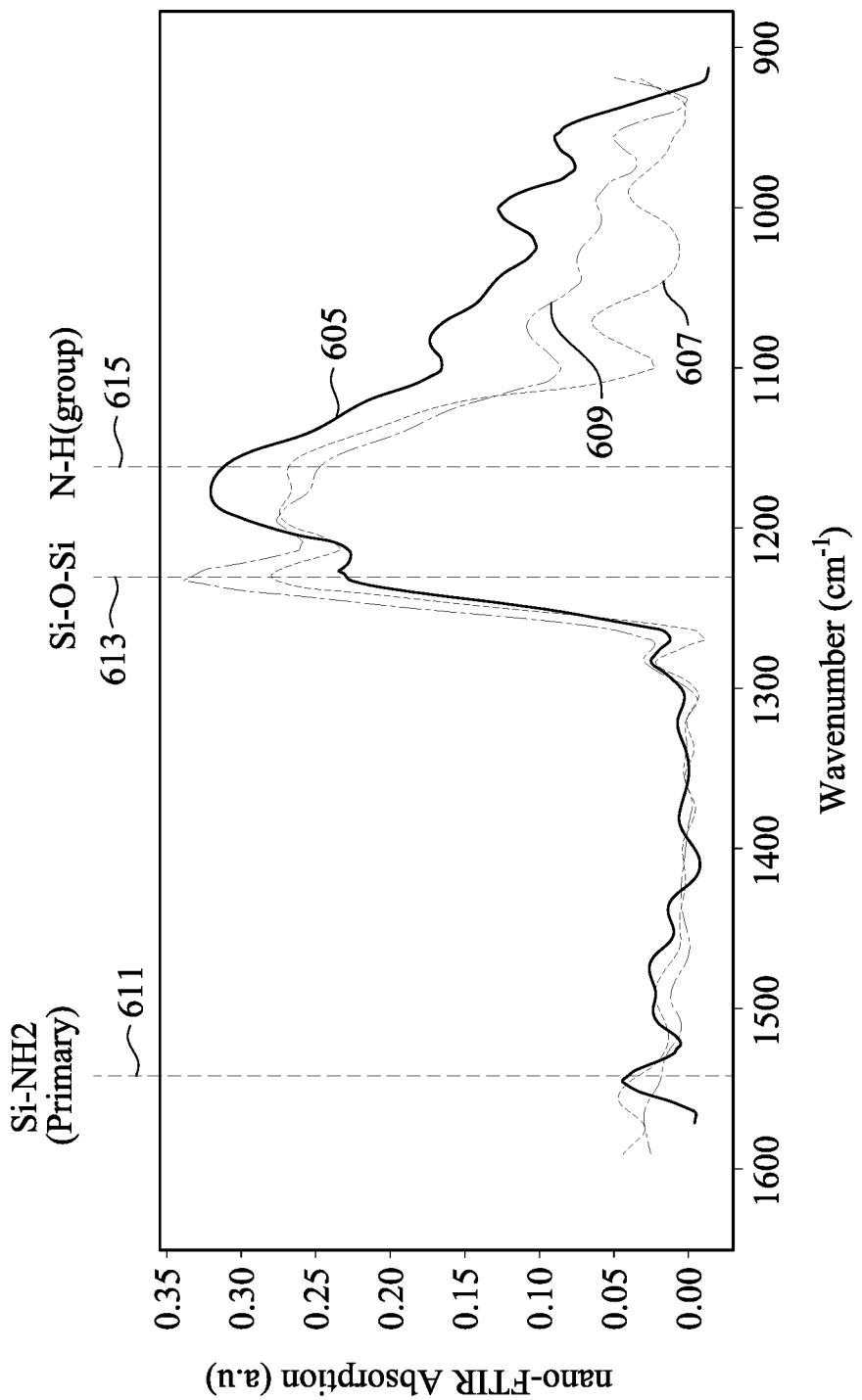

FIG. 6I illustrates a composition of the material of the third liner 601 as deposited (represented by the line labeled 605) at a temperature of 630° C., the material of the third liner 601 after the first wet annealing process (represented by the line labeled 607) and before the second wet annealing process, and the material of the third liner 601 after the first dry annealing process (represented by the line labeled 609). As can be seen again, the number of nitrogen bonds decreases from the as deposited composition through the first wet annealing process, to after the first dry annealing process. Similarly, the number of silicon to oxygen bonds increases from the as deposited composition through the first wet annealing process, to after the first dry annealing process. As such, the transformation of the material of the third liner 601 is achieved.

By depositing the third liner 601 as one material and then transforming the deposited material into a second material, the material of the third liner 601 can have different properties at different points in the manufacturing process. For example, by depositing the third liner 601 as a first material (e.g., SiON), the benefits of using the first material during the deposition process, such as a reduced amount of oxidation of the underlying fin 52, may be achieved. However, by subsequently changing the first material to a second material (e.g., $SiO_2$), better stiffness and device performance can be achieved to help prevent the fins 52 from bending during subsequent processes. As such, an overall better device performance can be obtained.

Figure 7:
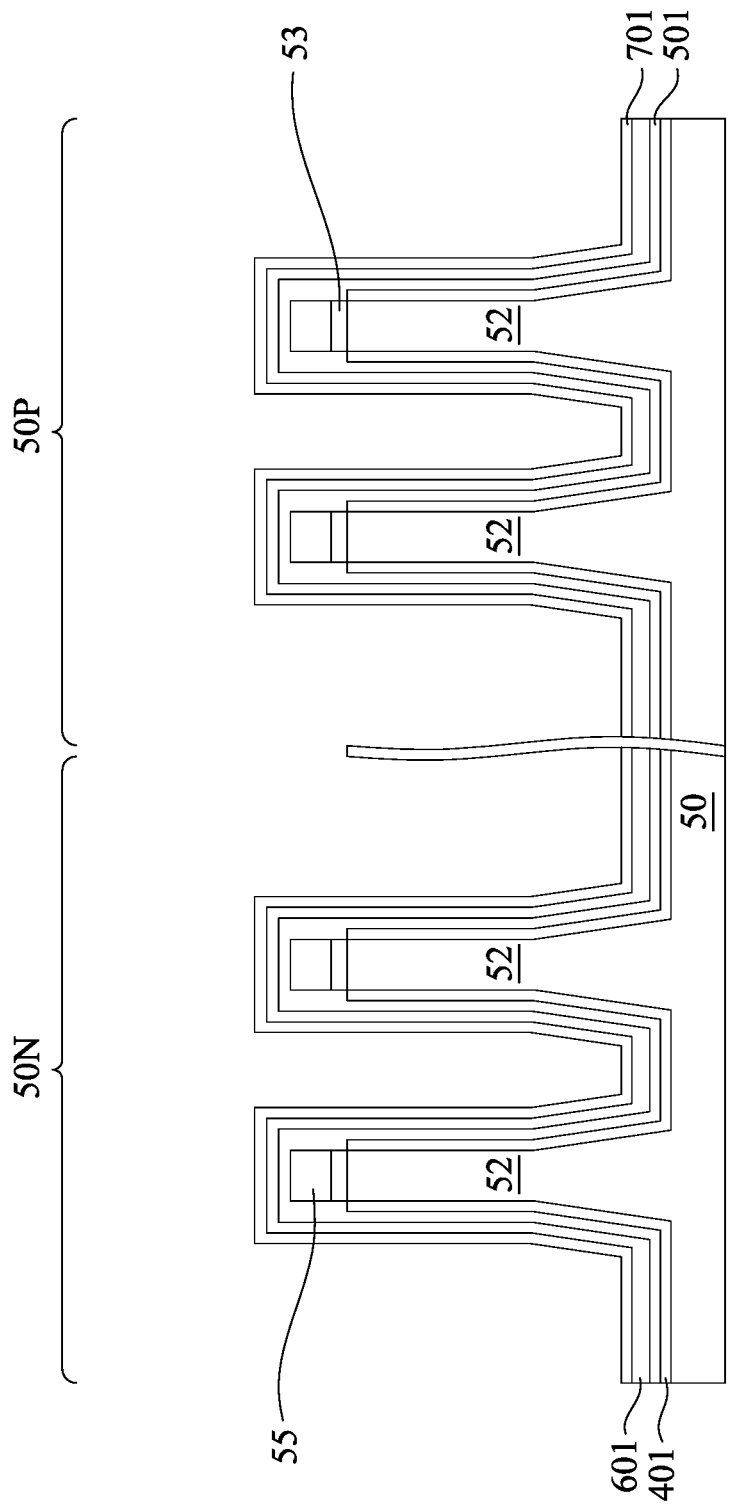

FIG. 7 illustrates a deposition of a fourth liner 701 over the third liner 601. In an embodiment the fourth liner 701 may be utilized to help ensure an adequate gap fill of the materials between the fins 52. As such, in some embodiments the fourth liner 701 may be an oxide material (e.g., silicon dioxide) that is deposited using a flowable process, such as a flowable CVD process. However, any suitable material and method of deposition may be utilized.

In an embodiment the fourth liner 701 may be deposited to a thickness of between about 10 Å and about 50 Å. Additionally, the fourth liner 701 may be formed to a density of between about 1.2 g/cm³ and about 2.5 g/cm³. However, any suitable thickness and density may be utilized.

In a particular embodiment, the fourth liner 701 may be deposited using a system that is similar to the deposition system described above with respect to FIG. 6B, although with different precursors placed into the first precursor delivery system 702, the second precursor delivery system 703, and/or the third precursor delivery system 705.

To begin the deposition process, a first precursor may be placed into one or more of the first precursor delivery system 702, the second precursor delivery system 703, and/or the third precursor delivery system 705. In an embodiment in which the fourth liner 701 is desired to be silicon dioxide, the first precursor may be a higher order silane ($Si_bH_{2n+2}$ for n>3) such as tetrasilane ($Si_4H_{10}$) (including n-$Si_4H_{10}$ and iso-$S_4H_{10}$), pentasilane ($Si_5H_{12}$) (including n-$Si_5H_{12}$, iso-$Si_5H_{12}$, and neo-$Si_5H_{12}$), cyclopentasilane ($Si_5H_{10}$), hexasilane ($Si_6H_{14}$) (including n-$Si_6H_{14}$ and iso-$Si_6H_{14}$), cyclo-$Si_6H_{12}$, heptasilane ($Si_7H_{16}$) (including n-$Si_7H_{16}$), combinations, or the like. However, any suitable precursor for any suitable material may be utilized.

Additionally, a second precursor may be placed into another one of the first precursor delivery system 702, the second precursor delivery system 703, and/or the third precursor delivery system 705. In an embodiment in which the fourth liner 701 is desired to be silicon dioxide and the first precursor is a high order silane, the second precursor may be a precursor such as oxygen ($O_2$), $H_2O$, $O_3$, combinations of these, or the like.

During the deposition process, the first precursor and the second precursor are introduced into the deposition chamber 733 as vapors (maintained by, e.g., the heating elements). However, as the first precursor flows over the substrates 50, the cooling elements remove heat and cause the first precursor to cool down below a transition temperature, causing the first precursor to condense onto the exposed surface of the substrates 100. Further, condensing as a liquid causes the first precursor to further flow into and fill the trenches between the fins 52 without voids. Additionally, once in place on the surface, the first precursor will react with the second precursor to form the material that is desired to be deposited (e.g., silicon dioxide) without voids and without seams.

Figure 8A:
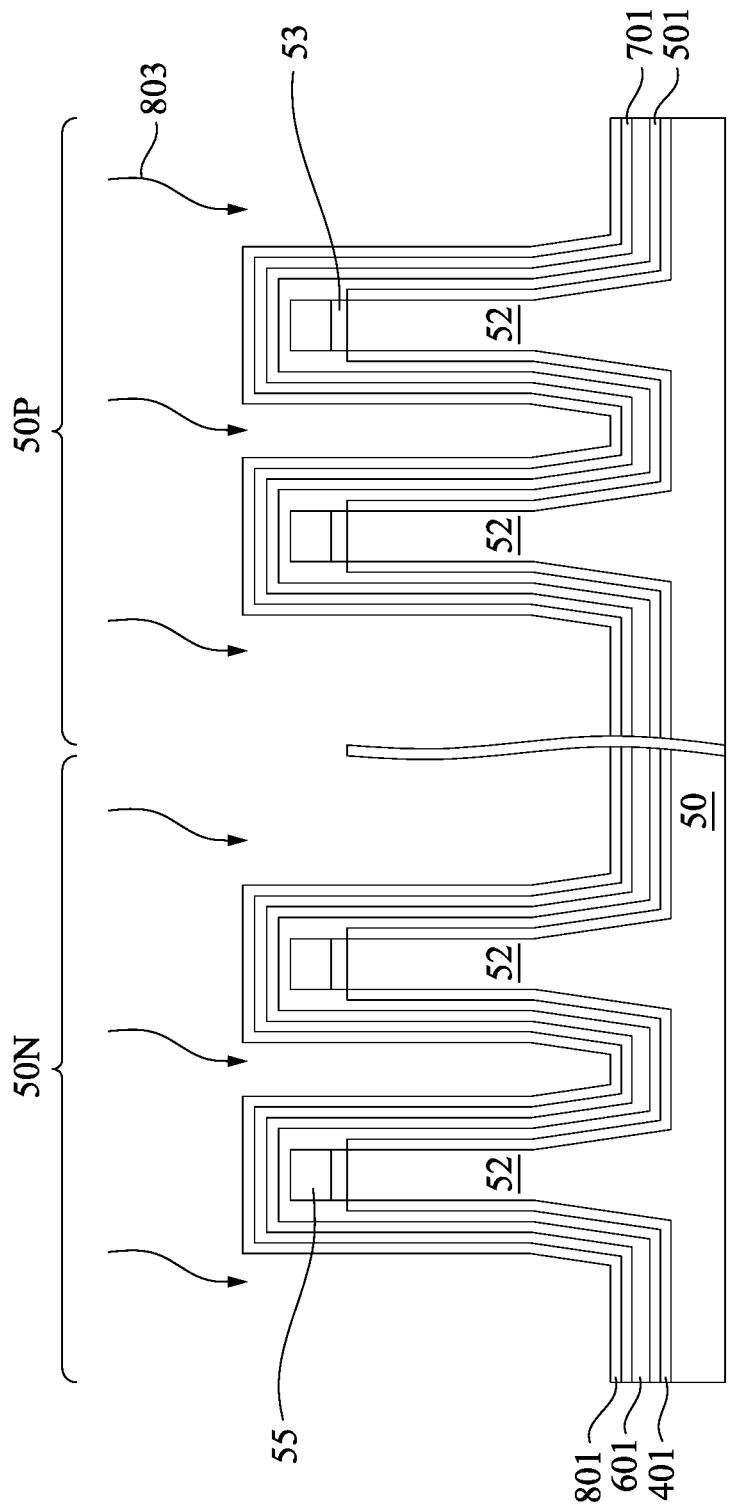

FIG. 8A illustrates formation of a capping layer 801 over the fourth liner 701. In an embodiment the capping layer 801 is formed in order to help prevent undesired bending of the fins 52 during subsequent processing. As such, in some embodiments the capping layer 801 may be deposited as a material such as silicon oxycarbonitride (SiOCN), ammonia doped silicon carbon nitride (SiCN), SiON, combinations of these or the like. However, any suitable materials may be utilized.

In an embodiment in which the capping layer 801 is deposited as SiOCN, the capping layer 801 may be formed using a similar system as the deposition system 731 described above with respect to FIG. 6B, and in some particular embodiments the capping layer 801 may be formed in the same deposition system 731 used to form the third liner 601. In such an embodiment a fourth precursor material may be placed into the fourth precursor delivery system 735 that can be used along with the first precursor material (e.g., hexachlorodisilane) and the second precursor material (e.g., oxygen) in order to form the material of the capping layer 801 (e.g., SiOCN). For example, in some embodiments the fourth precursor material may be a material such as triethylamine ($N(C_2H_5)_3$), $Si_2CH_2Cl_6$, combinations of these, or the like. However, any suitable precursor material may be utilized.

Once the first precursor material, the second precursor material, and the fourth precursor material have been placed into the first precursor delivery system 702, the second precursor delivery system 703, and the fourth precursor delivery system 735, respectively, the formation of the capping layer 801 may be initiated by placing one or more of the substrates 50 (e.g., 120 substrates 50) into the mounting rack 725 (e.g., a wafer boat) and then raising the mounting rack 725 into the deposition chamber 733.

Once the mounting rack 725 has been placed, a pressure within the deposition chamber 733 may be adjusted to the desired process pressures. In an embodiment the pressure may be adjusted to be between about 2000 Pa and about 5000 Pa, such as about 4660 Pa. Additionally, the temperature within the deposition chamber 733 may be ramped up to the desired process temperature, such as ramping the temperature to the desired process temperature from about 450° C. to be between about 500° C. and about 750° C., such as about 630° C. In a very particular embodiment the process temperature may be ramped up from a temperature of about 450° C. to a process temperature of about 630° C. However, any suitable process conditions may be utilized.

Then, after a vacuum check (VC) and a leak check, the atomic layer deposition cycle may be initiated by the control unit 715 sending an instruction to the precursor gas controller 713 to connect the first precursor delivery system 702 to the deposition chamber 733. Once connected, the first precursor delivery system 702 can deliver the first precursor material to the injection unit 719 through the precursor gas controller 713 and the manifold 717. The injection unit 719 can then disperse the first precursor material into the deposition chamber 733, wherein the first precursor material can be adsorbed and react with each of the exposed surfaces.

In one embodiment in which the capping layer 801 is silicon oxycarbonitride, the first precursor material (e.g., hexachlorodisilane) may be flowed into the deposition chamber 733 at a flow rate of between about 0.2 slm and about 6 slm, such as about 0.45 slm, with a flow pressure of between about 10 Pa and about 300 Pa, such as about 110 Pa, for a time of between about 2 seconds and about 60 seconds, such as about 20 seconds. However, any suitable flow rate may be utilized.

Figure 8C:
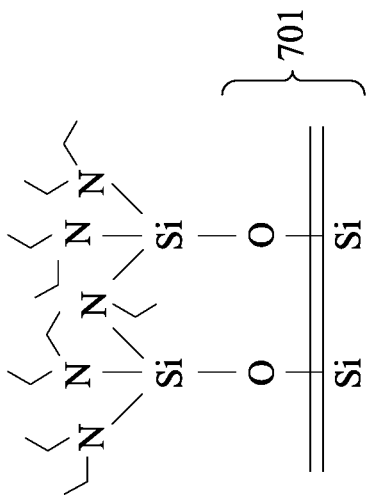
Figure 8E:
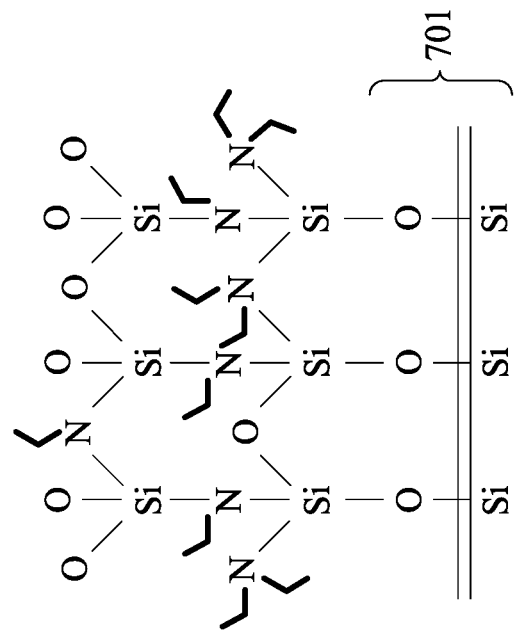
Figure 8B:
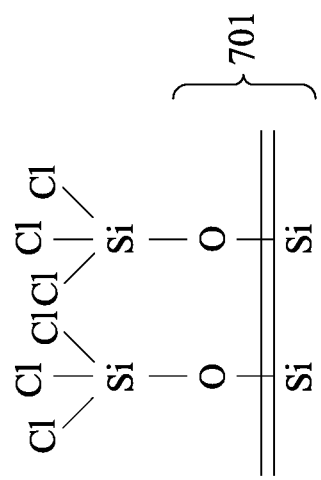

FIG. 8B illustrates a close-up view of a surface of the fourth liner 701 and illustrates that, in the embodiment in which a layer of silicon oxycarbonitride is desired to be formed using hexachlorodisilane, under these process conditions the hexachlorodisilane will react with the exposed surfaces (e.g., the fourth liner 701) in order to provide a surface wherein silicon is chemically bonded to the underlying surface while the opposite surface is terminated with chlorine atoms which are exposed to the ambient atmosphere within the deposition chamber 733. Additionally, the reaction of the hexachlorodisilane with the underlying structures will be self-limiting, providing a single layer of molecules once this step is completed.

After the self-limiting reaction has finished, the deposition chamber 733 may be purged off the first precursor material with a fourth purge process. For example, the control unit 715 may instruct the precursor gas controller 713 to disconnect the first precursor delivery system 702 (containing the first precursor material to be purged from the deposition chamber 733) and to connect the purge gas delivery system 707 to deliver the purge gas to the deposition chamber 733. In an embodiment the purge gas delivery system 707 may deliver a purge flow pressure of about 66 Pa for a time period of between about 13 seconds. Additionally, the control unit 715 may also initiate the vacuum pump 729 in order to apply a pressure differential to the deposition chamber 733 to aid in the removal of the first precursor material. The purge gas, along with the vacuum pump 729, may purge the first precursor material from the deposition chamber 733.

After the purge of the first precursor material has been completed, the introduction of the fourth precursor material (e.g., triethylamine) to the deposition chamber 733 may be initiated by the control unit 715 sending an instruction to the precursor gas controller 713 to disconnect the purge gas delivery system 707 and to connect the fourth precursor delivery system 735 (containing the fourth precursor material) to the deposition chamber 733. Once connected, the fourth precursor delivery system 735 can deliver the fourth precursor material to the injection unit 719. The injection unit 719 can then disperse the fourth precursor material into the deposition chamber 733.

In the embodiment discussed above to form a layer of silicon oxycarbonitride with hexachlorodisilane as the first precursor material and triethylamine as the fourth precursor material, the fourth precursor material may be introduced into the deposition chamber 733 at a flow rate of between about 0.2 slm and about 6 slm, such as about 0.8 slm, with a flow pressure of between about 10 Pa and about 1500 Pa, such as about 931 Pa, for at time of between about 2 seconds and about 80 seconds, such as about 20 seconds. However, as one of ordinary skill in the art will recognize, these flow rates are only intended to be illustrative, as any suitable process conditions may be utilized while remaining within the scope of the embodiments.

FIG. 8C illustrates a close-up view of the surface of the fourth liner 701 and illustrates that, in the embodiment in which a layer of silicon oxycarbonitride is desired to be formed using hexachlorodisilane as the first precursor material and triethylamine as the fourth precursor material, under these process conditions the triethylamine will react with the exposed surfaces (e.g., the product of the reaction of the first precursor material) in order to provide a surface wherein nitrogen is chemically bonded to the underlying surface (e.g., silicon) while the opposite surface is terminated with ethyl groups which are exposed to the ambient atmosphere within the deposition chamber 733. Additionally, the reaction of the triethylamine with the underlying structures will be self-limiting, providing a single layer of molecules once this step is completed.

After the reaction of the fourth precursor material has finished, the deposition chamber 733 may be purged off the fourth precursor material with a fifth purge process. For example, the control unit 715 may instruct the precursor gas controller 713 to disconnect the fourth precursor delivery system 735 (containing the fourth precursor material to be purged from the deposition chamber 733) and to connect the purge gas delivery system 707 to deliver the purge gas to the deposition chamber 733. In an embodiment the purge gas delivery system 707 may deliver the purge gas at a flow pressure of about 66 Pa for a time period of between about 12 seconds. Additionally, the control unit 715 may also initiate the vacuum pump 729 in order to apply a pressure differential to the deposition chamber 733 to aid in the removal of the fourth precursor material. The purge gas, along with the vacuum pump 729, may purge the fourth precursor material from the deposition chamber 733.

After the purge of the fourth precursor material has been completed, the introduction of the second precursor material (e.g., oxygen) to the deposition chamber 733 may be initiated by the control unit 715 sending an instruction to the precursor gas controller 713 to disconnect the purge gas delivery system 707 and to connect the second precursor delivery system 703 (containing the second precursor material) to the deposition chamber 733. Once connected, the second precursor delivery system 703 can deliver the second precursor material to the injection unit 719. The injection unit 719 can then disperse the second precursor material into the deposition chamber 733.

In the embodiment discussed above to form a layer of silicon oxycarbonitride with hexachlorodisilane as the first precursor material, oxygen as the second precursor material, and triethylamine as the fourth precursor material, the second precursor material may be introduced into the deposition chamber 733 at a flow rate of between about 0.2 slm and about 80 slm, such as about 5 slm, with a flow pressure of between about 200 Pa and about 4600 Pa, such as about 1200 Pa, for a time period of between about 3 seconds and about 120 seconds, such as about 55 seconds. However, as one of ordinary skill in the art will recognize, these flow rates are only intended to be illustrative, as any suitable process conditions may be utilized while remaining within the scope of the embodiments.

Figure 8D:
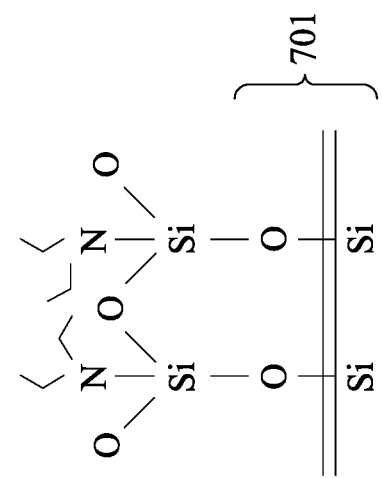

FIG. 8D illustrates a close up view of the surface of the fourth liner 701 and illustrates that, in the embodiment in which a layer of silicon oxycarbonitride is desired to be formed using hexachlorodisilane as the first precursor material, oxygen as the second precursor material, and triethylamine as the fourth precursor material, under these process conditions the oxygen will react with the exposed surfaces in order to provide a surface wherein oxygen is chemically bonded to the underlying surfaces (e.g., silicon) while the opposite surface is still partially terminated with ethyl groups along with the oxygen atoms which are exposed to the ambient atmosphere within the deposition chamber 733.

After the reaction of the second precursor material has finished, the deposition chamber 733 may be purged off the second precursor material with a sixth purge process. For example, the control unit 715 may instruct the precursor gas controller 713 to disconnect the second precursor delivery system 703 (containing the second precursor material to be purged from the deposition chamber 733) and to connect the purge gas delivery system 707 to deliver the purge gas to the deposition chamber 733. In an embodiment the purge gas delivery system 707 may deliver the purge gas at a flow pressure of about 66 Pa for a time period of between about 3 seconds. Additionally, the control unit 715 may also initiate the vacuum pump 729 in order to apply a pressure differential to the deposition chamber 733 to aid in the removal of the second precursor material. The purge gas, along with the vacuum pump 729, may purge the second precursor material from the deposition chamber 733.

After the deposition chamber 733 has been purged using the sixth purge process, a first cycle for the formation of the capping layer 801 has been completed, and a second cycle similar to the first cycle may be started. For example, the repeated cycle may introduce the first precursor material, purge with the purge gas, pulse with the fourth precursor material, purge with the purge gas, pulse with the second precursor material, and purge with the purge gas.

As can be seen, each cycle of the first precursor material, the fourth precursor material, and the second precursor material can deposit another layer of the desired material for the capping layer 801 (e.g., silicon oxycarbonitride (SiOCN)) at a rate of about 0.6 Å per cycle, as can be seen in FIG. 8E, which illustrates the structure after two such cycles. Additionally, each cycle also resets the exposed surface so that the exposed surface is prepared to receive the next cycle of the first precursor material, the fourth precursor material, and the second precursor material. These cycles may be repeated to form the capping layer 801 to a thickness that is either larger than or smaller than the thickness of the third liner 601, such as a thickness of between about 10 Å and about 70 Å. Additionally, the capping layer 801 may be formed to have a density of between about 2 g/cm$^3$ and about 2.6 g/cm$^3$. However, any suitable thickness and density may be utilized.

Once the depositions cycles have been finished, a removal process may be performed to remove the substrates 50 from the deposition system 731. In one embodiment the removal process may include a gas line purge, a post purge (using, e.g., the third precursor material of ammonia), a ramp down of the temperature from, e.g., 640° C. to about 300° C., and a back filling of the ambient within the deposition chamber to ambient atmosphere. Once this has been performed, the substrates 50 may be removed from the deposition systems 731.

By utilizing the process as described above, the capping layer 801 may be formed with a desired second composition. For example, using the times and temperatures as described above, the capping layer 801 may be formed with a nitrogen composition of greater than 0% and less than 10%. Additionally, the capping layer 801 may be formed with a carbon concentration of greater than 0% and less than about 10%. If the nitrogen concentration is greater than about 10% or the carbon concentration is greater than about 10%, adjacent fins 52 may bend inwardly, causing gap fill problems with subsequent depositions. Additionally, the capping layer 801 may be formed with a silicon composition of between about 25% and about 40%, and an oxygen concentration of between about 40% and about 70%. Additionally, the capping layer 801 may be formed with a density of between about 2 g/cm$^3$ and about 3 g/cm$^3$. However, any suitable compositions may be utilized.

FIG. 8A additionally illustrates that, once the capping layer 801 has been deposited, a second annealing process (represented in FIG. 8A by the wavy lines labeled 803) may be utilized to transform the material of the capping layer 801 to another material by removing some or all of the nitrogen and carbon within the material of the capping layer 801, although the capping layer 801 may still have a concentration of nitrogen greater than 0% and less than 10% and may still have a concentration of carbon that is greater than 0% and less than 10%. In a particular embodiment in which the material of the capping layer 801 is deposited as SiOCN, the second annealing process 803 may be similar to the first annealing process 603 (described above with respect to FIG. 6A). For example, the second annealing process 803 may comprise the first wet annealing process, the second wet annealing process, and the first dry annealing process. However, any suitable annealing processes may be utilized.

Figure 8G:
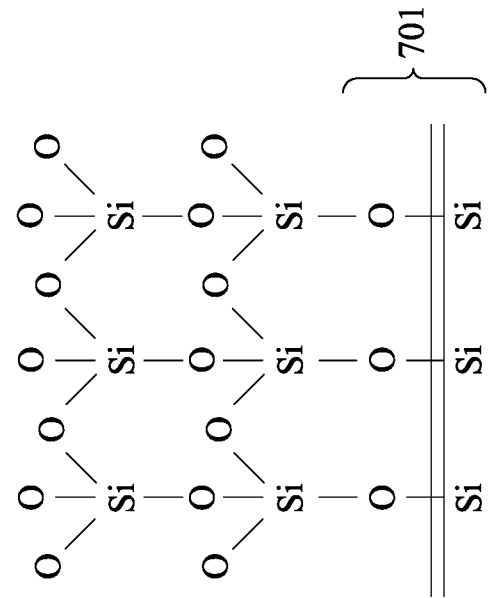
Figure 8F:
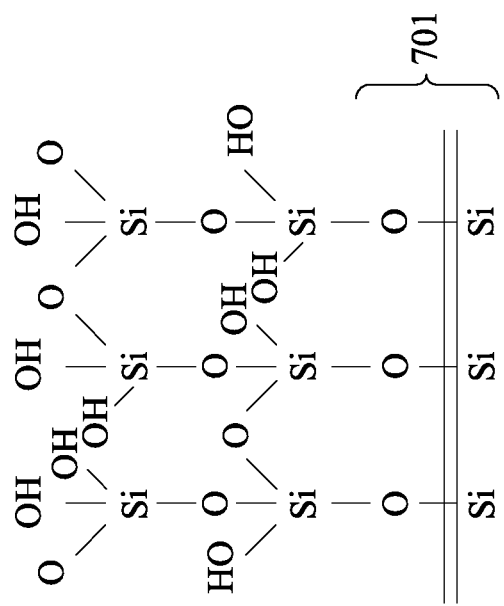

FIG. 8F illustrates the structures of the capping layer 801 after the first wet annealing process and the second wet annealing process of the second annealing process 803. As can be seen, the moisture will react with the material of the capping layer 801 and at least partially or completely replace the carbon with hydroxyl groups. Further, FIG. 8G illustrates the material of the capping layer 801 after the first dry annealing process of the second annealing process 803. As can be seen, the first dry annealing process of the second annealing process 803 will cause the hydroxyl groups to decompose and leave behind oxygen to silicon bonds. As such, the original material of the capping layer 801 (e.g., SiOCN) is transformed to silicon dioxide.

Additionally, while the above description utilizes both the first annealing process 603 (described above with respect to FIG. 6A) along with the second annealing process 803 to transform the third liner 601 and the capping layer 801 immediately after these materials have been deposited, this is intended to be illustrative and is not intended to limit the embodiments. Any suitable rearrangement of the order of steps or even the consolidation of the process steps, may also be utilized.

For example, in certain particular embodiments, the first annealing process 603 and the second annealing process 803 are consolidated into a single annealing process. As a single annealing process, the single annealing process would be performed after the deposition of the material for the capping layer 801. As such, a single process may be utilized to transform the material for both the capping layer 801 and the third liner 601. Any suitable combination of process steps may be utilized.

By depositing the capping layer 801 as a first material and then transforming the capping layer 801 to a second material, the capping layer 801 will expand after deposition. Additionally, the expansion helps to modulate any bending of the fins 52 which may affect subsequent deposition processes (e.g., deposition of the dummy gate layer 62) and allows for a better gap fill during the deposition processes.

Optionally, in some embodiments a capping liner (not separately illustrated) may be deposited over the capping layer 801. In some embodiments the capping liner may be similar to the second liner 501 (e.g., silicon dioxide). In such an embodiment the capping layer 801 may be deposited to a thickness of about 20 Å and the capping liner may have a thickness of between about 17.5 Å and about 40 Å. In another embodiment the capping layer 801 may be deposited to a thickness of about 50 Å and the capping liner may have a thickness of between about 17.5 Å and about 20 Å. However, any suitable material and thicknesses may be utilized.

Figure 9:
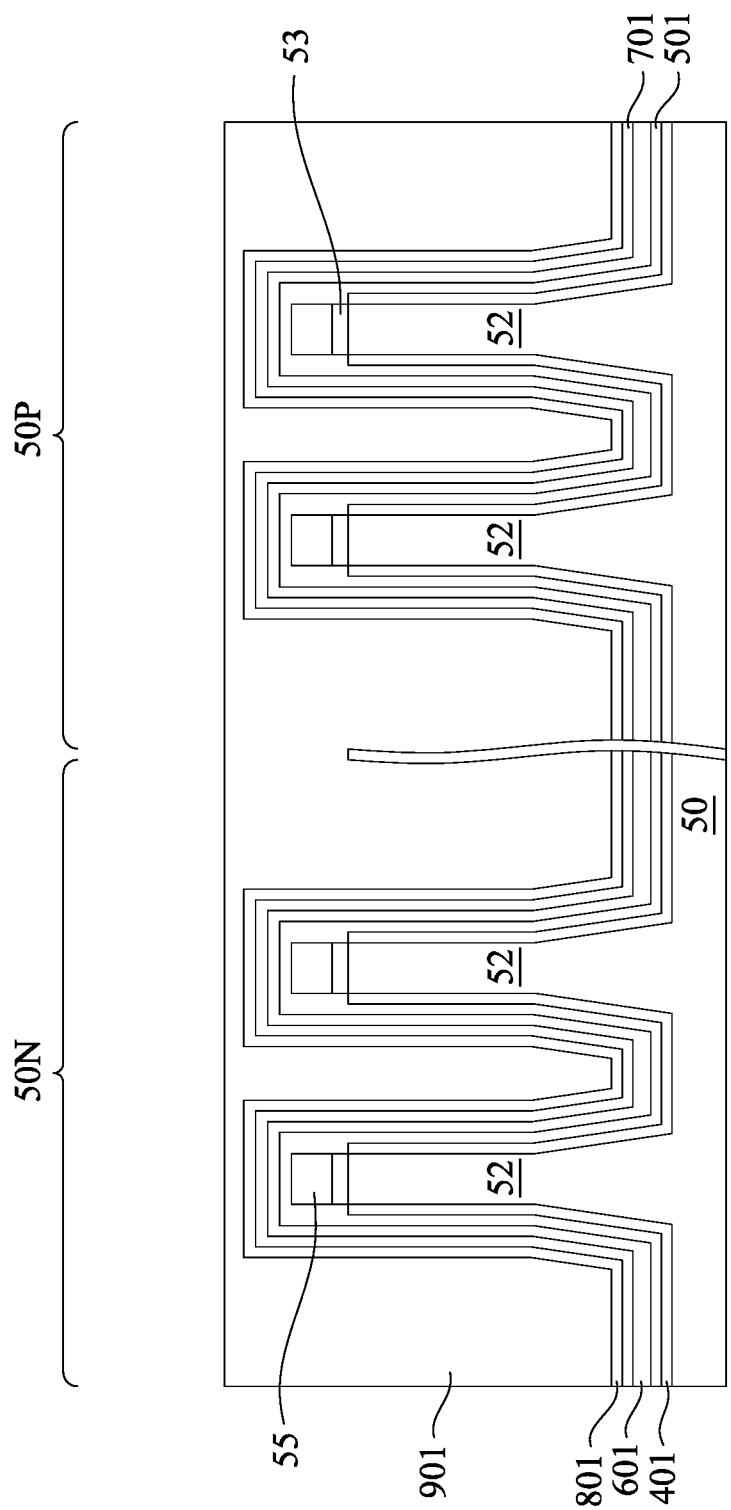

In FIG. 9 a dielectric cap 901 is formed over the capping layer 801 and between neighboring fins 52. The dielectric cap 901 may be an oxide, such as silicon dioxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the dielectric cap 901 is silicon dioxide formed by a FCVD process.

In an embodiment the dielectric cap 901 may be formed to a thickness of between about 10 Å and about 50 Å and to a density of between about 2 g/cm$^3$ and about 2.6 g/cm$^3$. If the dielectric cap 901 is formed below about 10 Å, there is an impact of the device's isolation, while if the dielectric cap 901 has been formed thicker than about 50 Å, there is an impact to the hybrid film.

Figure 10:
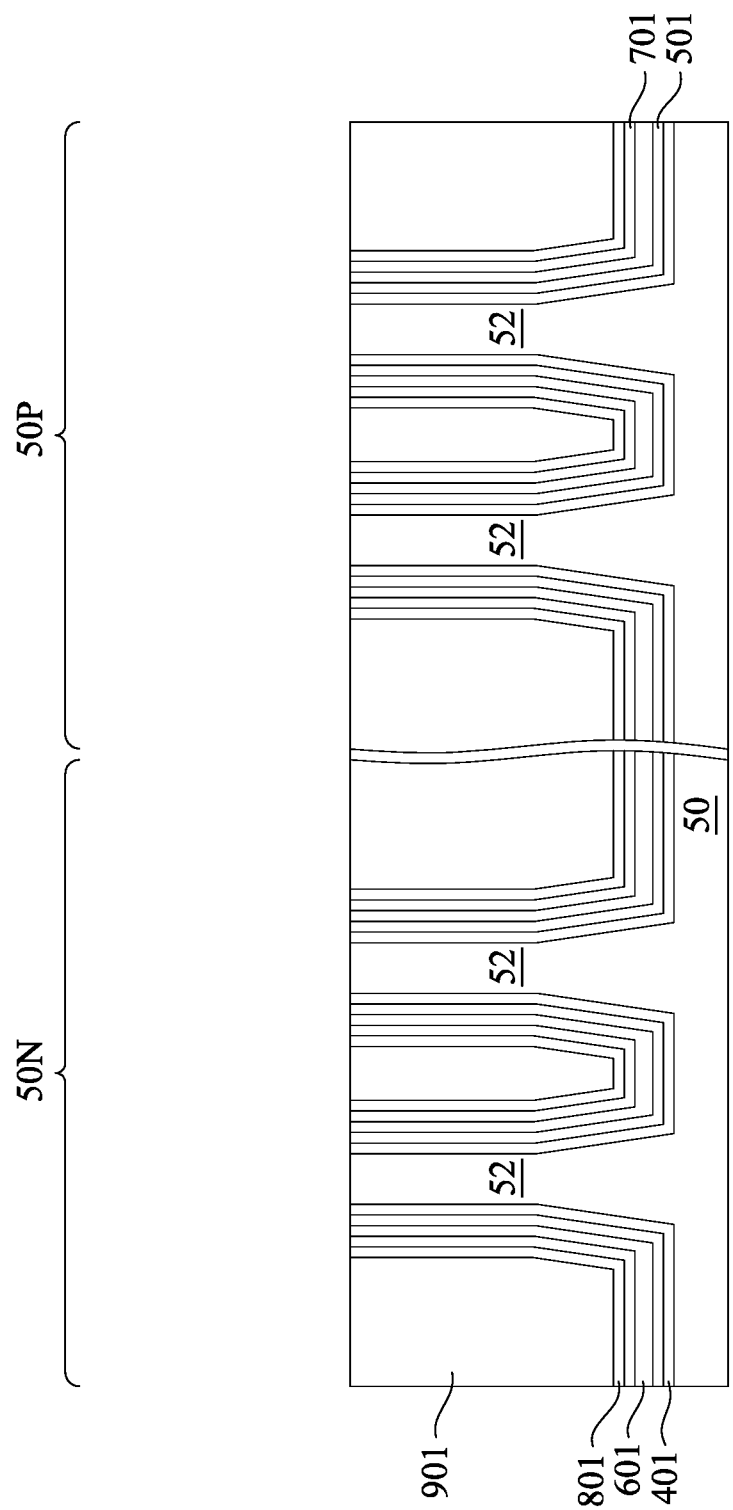

In FIG. 10, a removal process is applied to the dielectric cap 901 to remove excess dielectric cap 901 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the dielectric cap 901 are level after the planarization process is complete. In embodiments in which the first mask layer 53 and the second mask layer 55 remain on the fins 52, the planarization process may expose the mask or remove the first mask layer 53 and the second mask layer 55 such that top surfaces of the first mask layer 53, the second mask layer 55, or the fins 52, respectively, and the dielectric cap 901 are level after the planarization process is complete.

Figure 11:
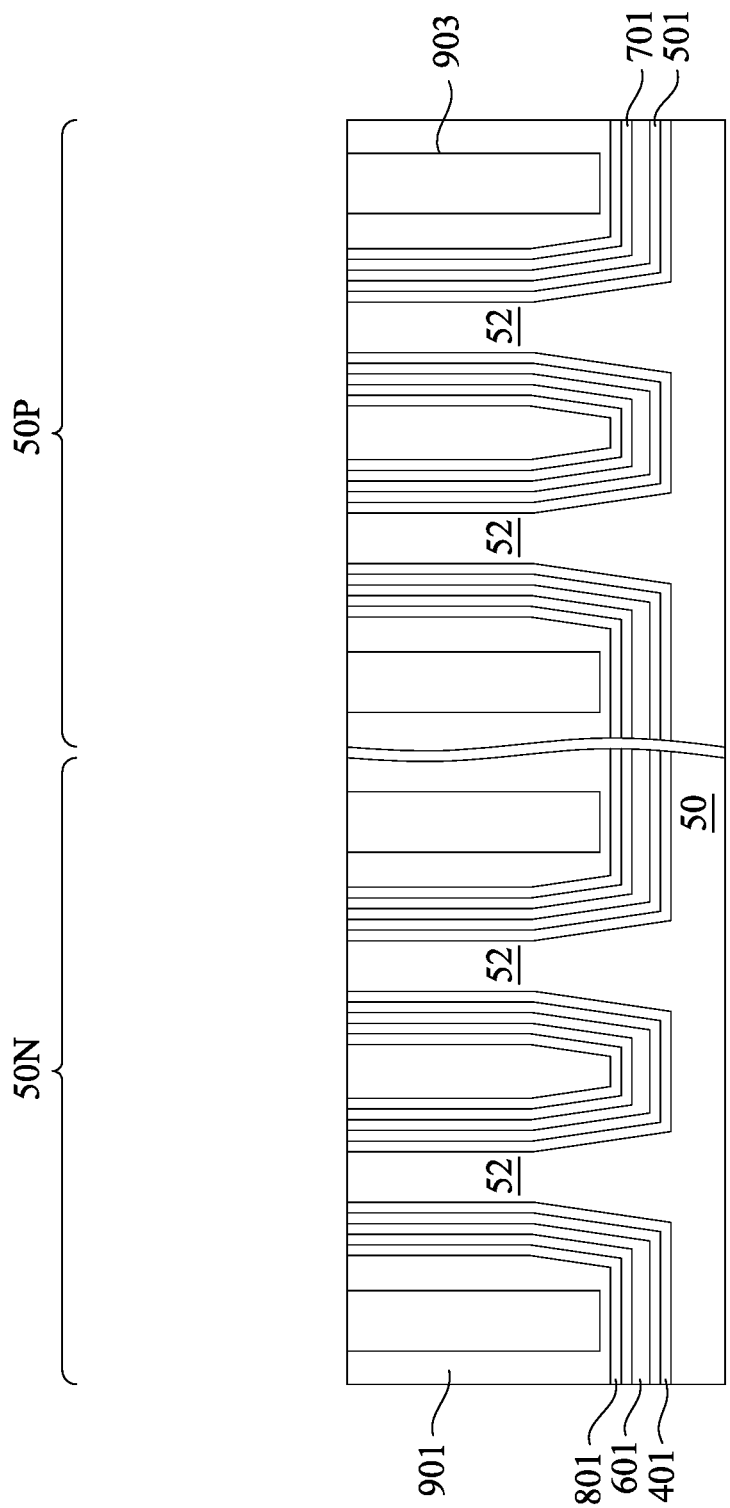

FIG. 11 illustrates formation of dielectric fins 903 within the dielectric cap 901 in order to help electrically separate adjacent fins 52 from each other. In an embodiment an opening may be formed within the dielectric cap 901 using, e.g., a photolithographic masking and etching process. Once the opening has been formed, the opening may be filled with one or more dielectric materials to form the dielectric fins 903, such as silicon dioxide, silicon nitride, silicon carbon nitride, combinations of these, or the like, using a deposition process such as atomic layer deposition, chemical vapor deposition, sputtering, combinations of these, or the like. Once deposited, the materials of the dielectric fins 903 may be planarized using a process such as chemical mechanical polishing.

Figure 12:
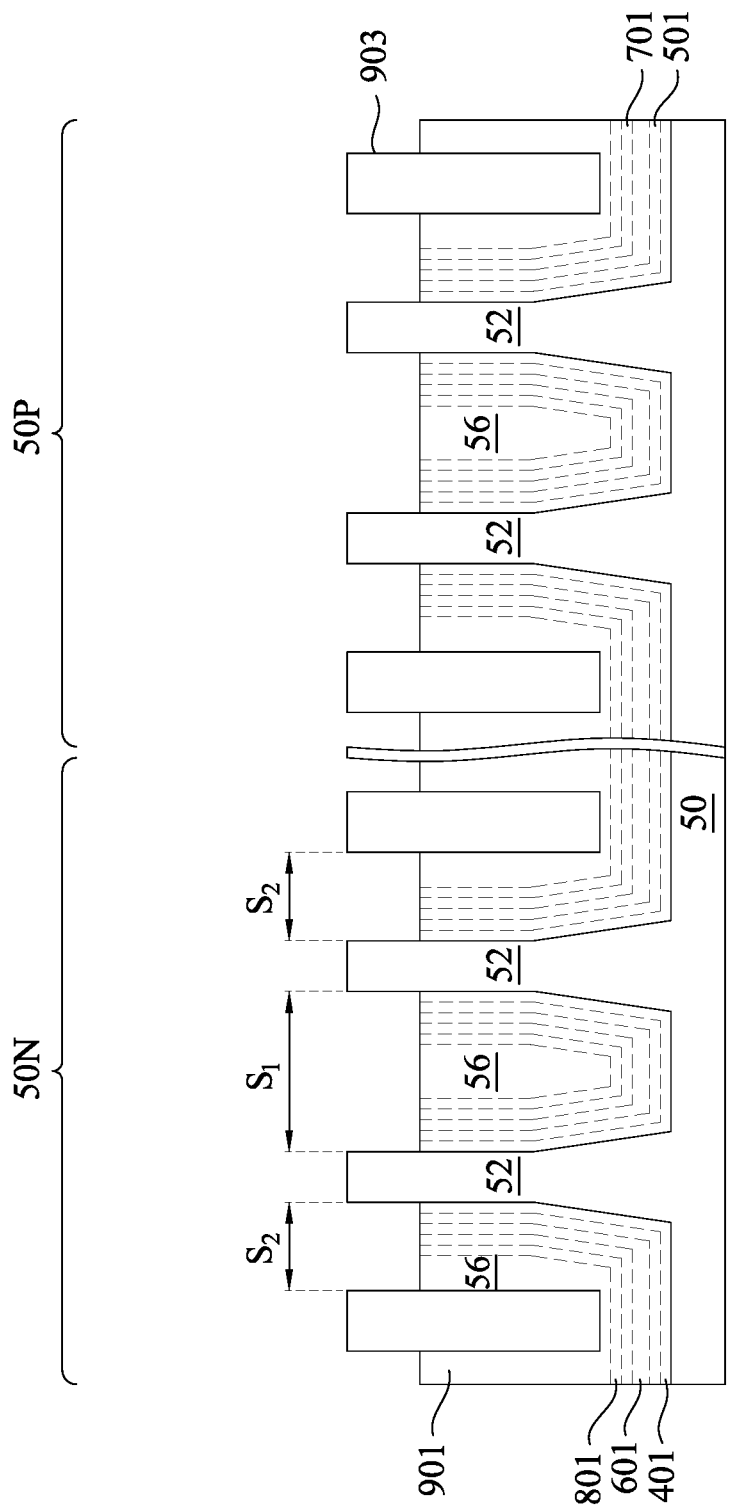

In FIG. 12, the dielectric cap 901, the capping layer 801, the fourth liner 701, the third liner 601, the second liner 501, and the first liner 401 are recessed to form Shallow Trench Isolation (STI) regions 56 (wherein for clarity dielectric cap 901, the capping layer 801, the fourth liner 701, the third liner 601, the second liner 501, and the first liner 401 are illustrated in dashed lines in FIG. 12 but as a single structure for a remainder of the application). The dielectric cap 901, the capping layer 801, the fourth liner 701, the third liner 601, the second liner 501, and the first liner 401 are recessed using one or more etching processes such that upper portions of fins 52 and the dielectric fin 903 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etches. The STI regions 56 may be recessed using one or more acceptable etching processes, such as processes that are selective to the materials of the dielectric cap 901, the capping layer 801, the fourth liner 701, the third liner 601, the second liner 501, and the first liner 401 (e.g., etches the material of the dielectric cap 901 at a faster rate than the material of the fins 52 and the dielectric fin 903). For example, an oxide removal using, for example, dilute hydrofluoric (dHF) acid may be used.

By utilizing the processes described herein, the fins 52 can be prevented from bending while still being able to prevent excess oxidation. As such, the spacing between fins 52 (e.g., without a dielectric fin 903 being located between fins 52) can be kept to a first spacing $S_1$ of between about 5 nm and about 30 nm. Additionally, a second spacing $S_2$ between the fins 52 and the dielectric fin 903 can be kept to be between about 5 nm and about 30 nm. If the fins 52 bend so that these spacings are undesirably reduced, subsequent depositions of materials between adjacent fins 52 or between the fins 52 and the dielectric fins 903 can have gap fill problems.

The process described with respect to FIGS. 2 through 12 is just one example of how the fins 52 may be formed. In some embodiments, the fins may be formed by an epitaxial growth process. For example, prior to formation of the STI regions 56, a dielectric layer can be formed over a top surface of the substrate 50, and trenches can be etched through the dielectric layer to expose the underlying substrate 50. Homoepitaxial structures can be epitaxially grown in the trenches, and the dielectric layer can be removed. Additionally, in some embodiments, heteroepitaxial structures can be used for the fins 52. For example, the fins 52 in FIG. 10 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be removed. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$ where x can be in the range of 0 to 1), silicon carbide, pure or substantially pure germanium, an III-V compound semiconductor, an II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, or the like.

Further in FIG. 12, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 13:
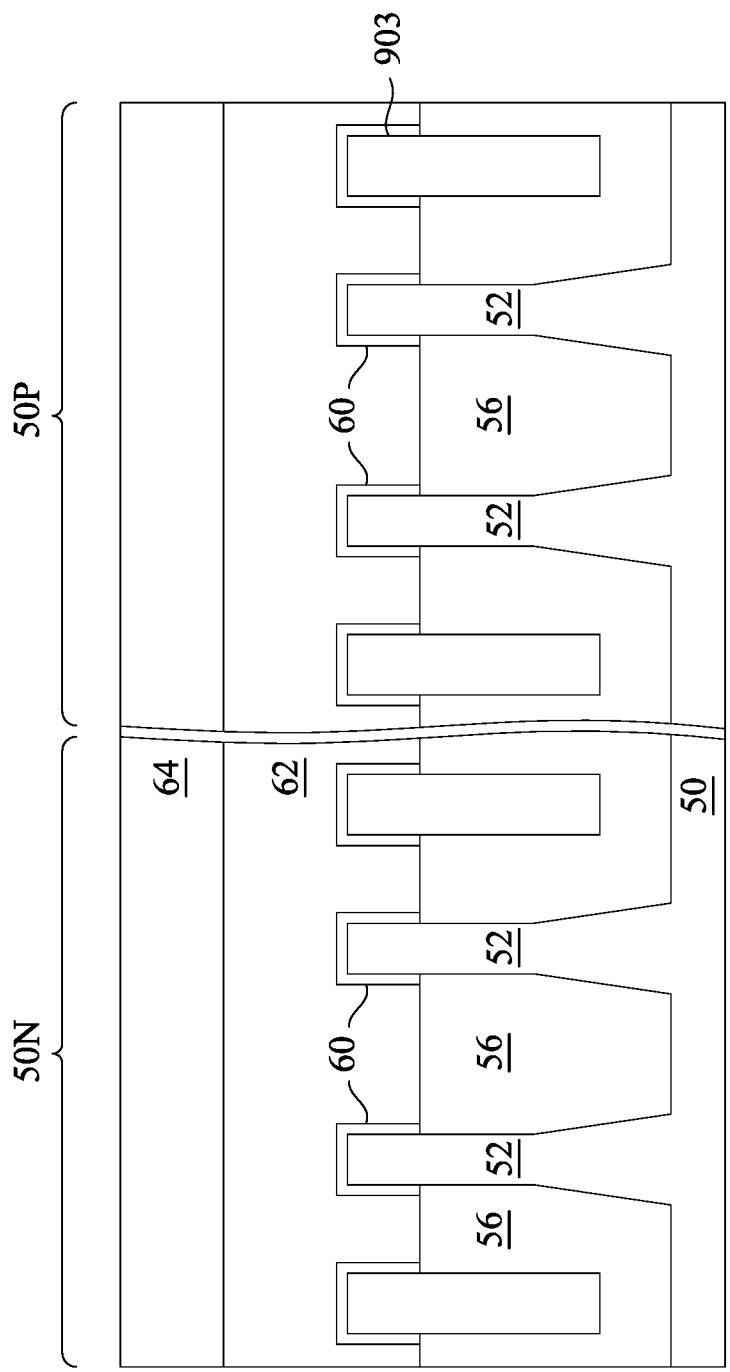

In FIG. 13, a dummy dielectric layer 60 is formed on the fins 52 and the dielectric fin 903. The dummy dielectric layer 60 may be, for example, silicon dioxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 14A through 22B illustrate various additional steps in the manufacturing of embodiment devices. FIGS. 14A through 22B illustrate features in either of the n-type region 50N and the p-type region 50P. For example, the structures illustrated in FIGS. 14A through 22B may be applicable to both the n-type region 50N and the p-type region 50P. Differences (if any) in the structures of the n-type region 50N and the p-type region 50P are described in the text accompanying each figure.

Figure 14B:
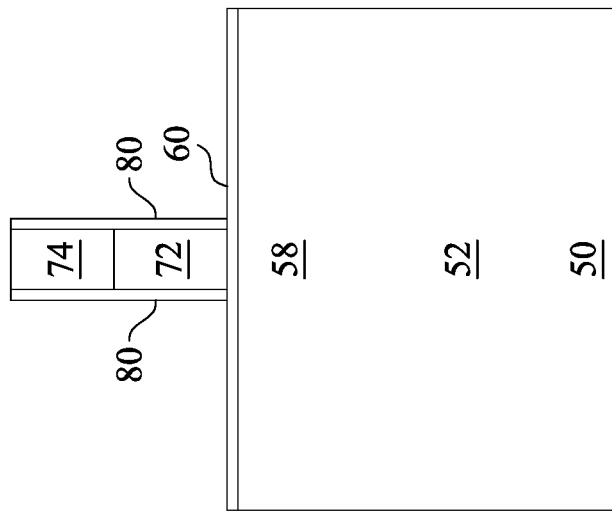
Figure 14A:
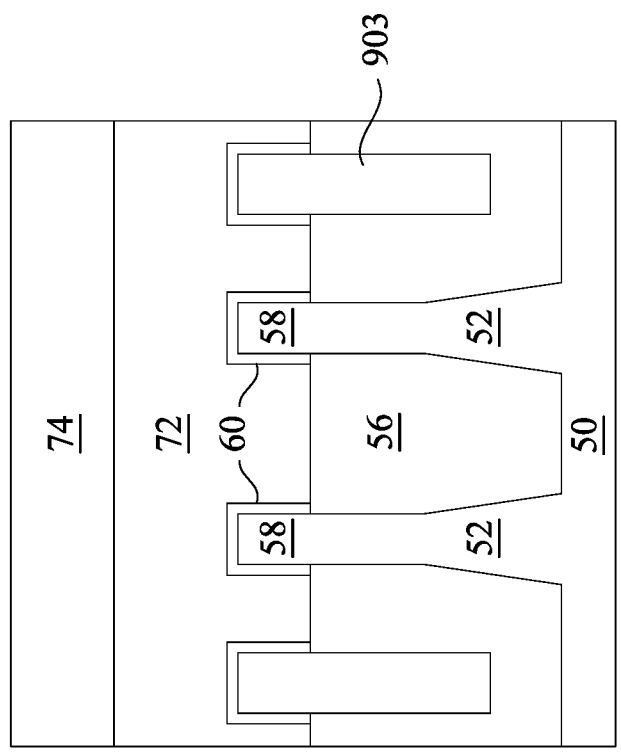

In FIGS. 14A and 14B, the mask layer 64 (see FIG. 13) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 14A and 14B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon dioxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 12, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 15B:
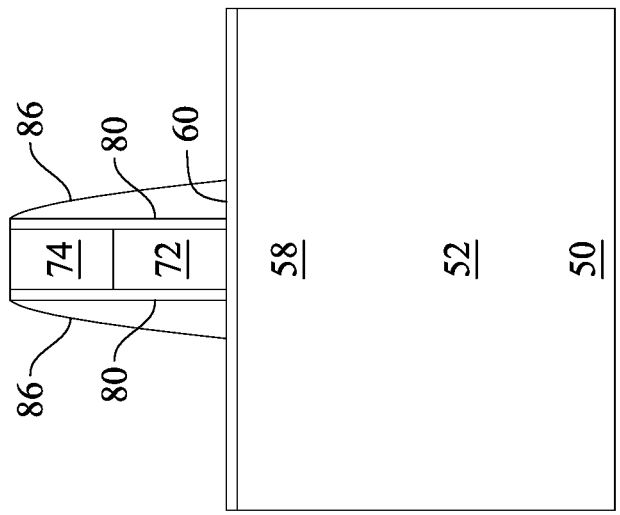
Figure 15A:
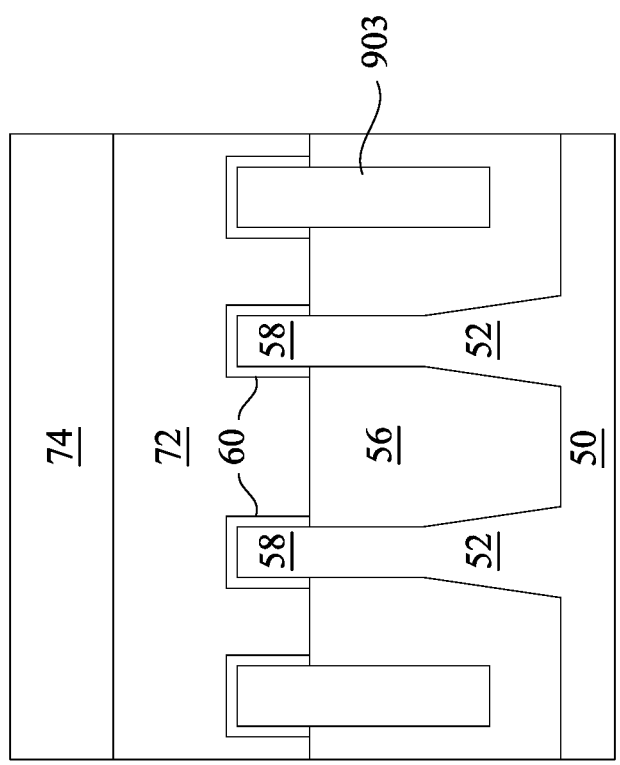

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon dioxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using different structures and steps. For example, LDD regions for n-type devices may be formed prior to forming the gate seal spacers 80 while the LDD regions for p-type devices may be formed after forming the gate seal spacers 80.

Figure 16B:
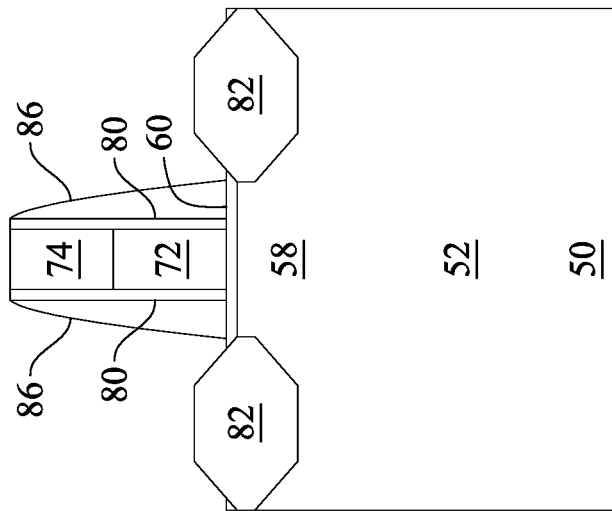
Figure 16A:
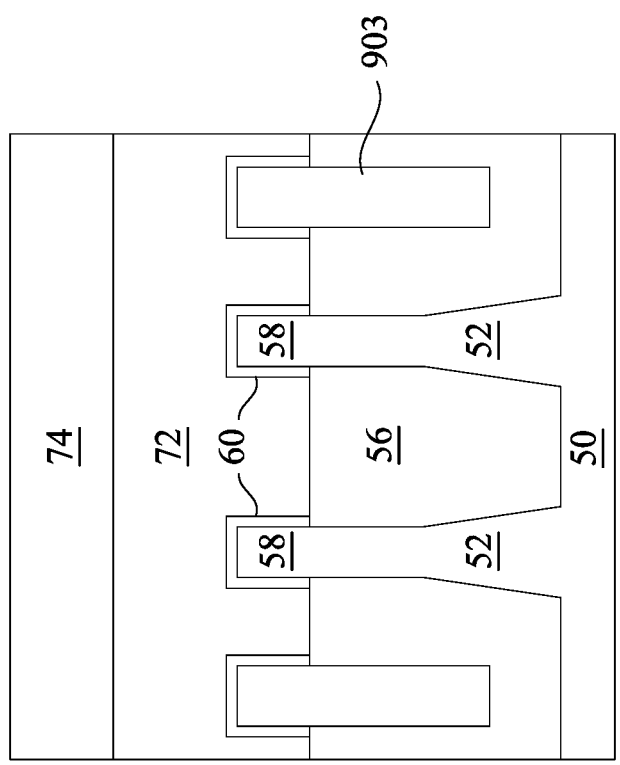
Figure 16C:
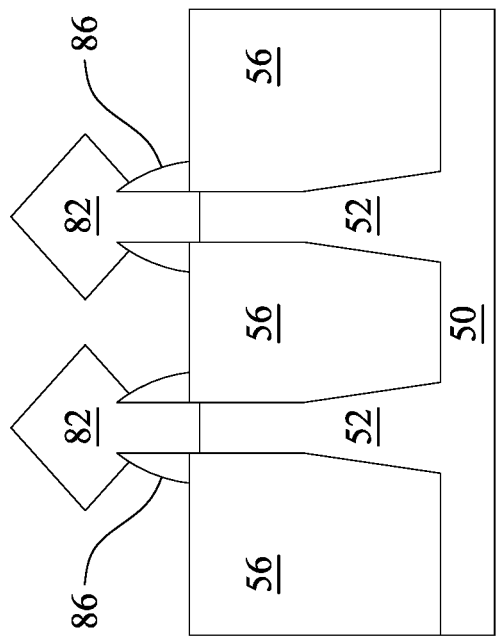
Figure 16D:
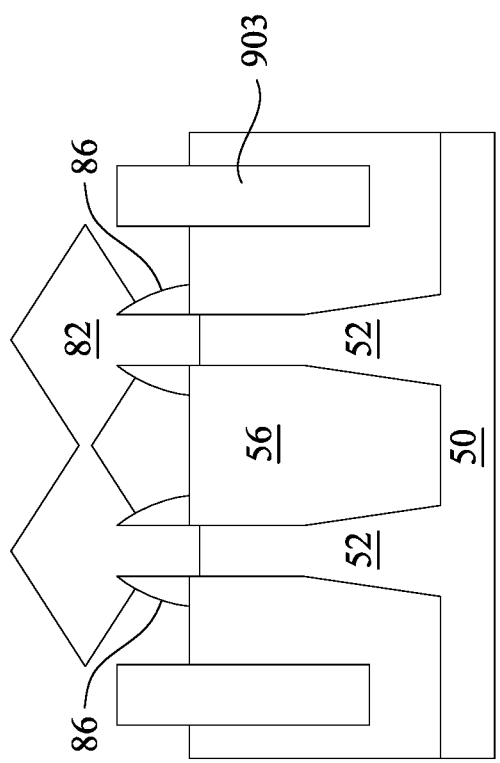

In FIGS. 16A and 16B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D. In the embodiments illustrated in FIGS. 16C and 16D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 17B:
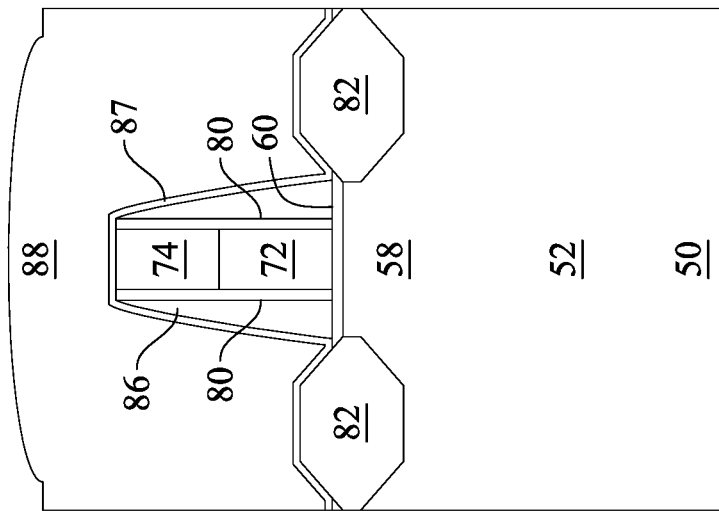
Figure 17A:
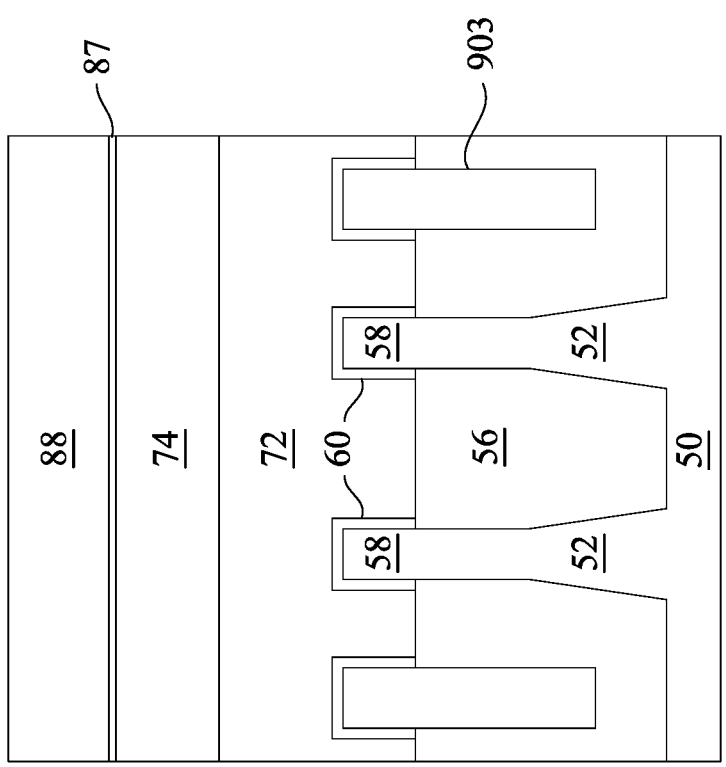

In FIGS. 17A and 17B, a first interlayer dielectric (ILD) 88 is deposited over the structure illustrated in FIGS. 16A and 16B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon dioxide, silicon oxynitride, or the like, having a lower etch rate than the material of the overlying first ILD 88.

Figure 18B:
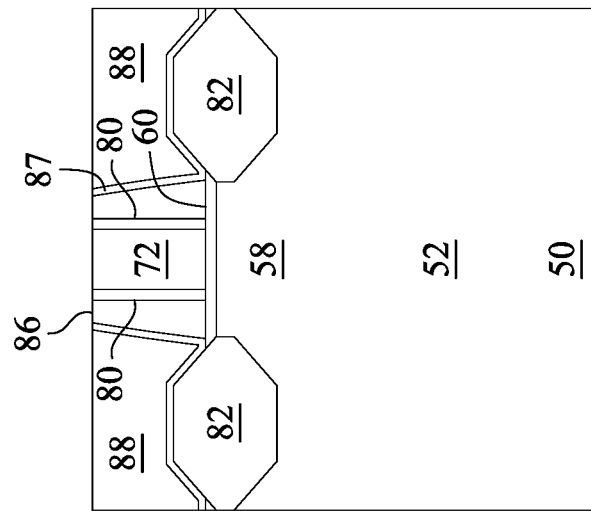
Figure 18A:
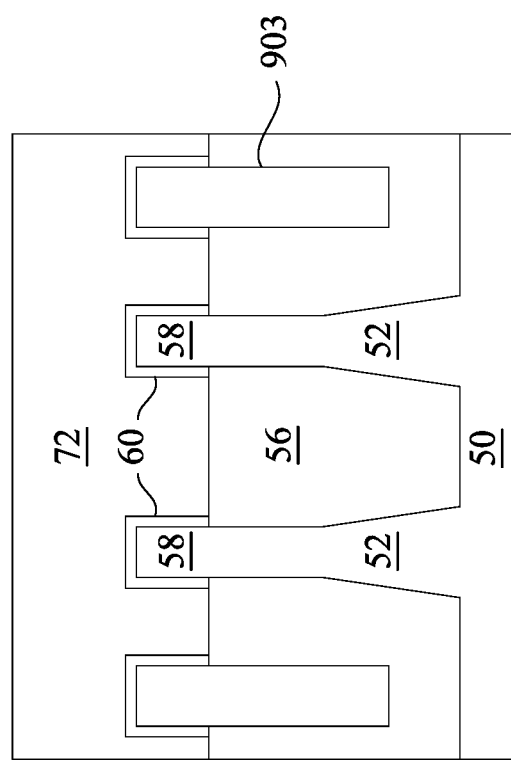

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 19B:
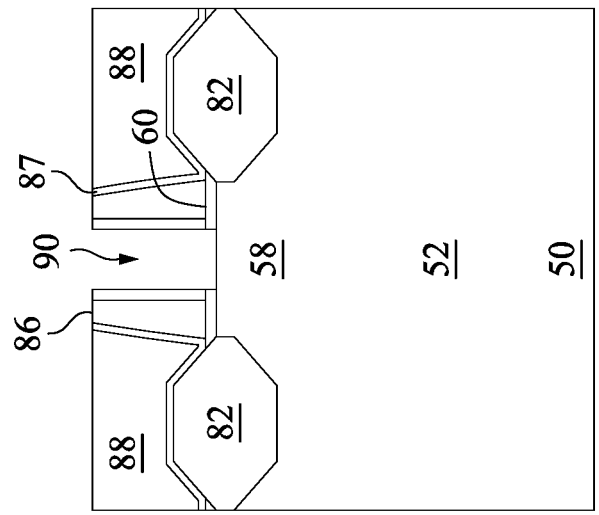
Figure 19A:
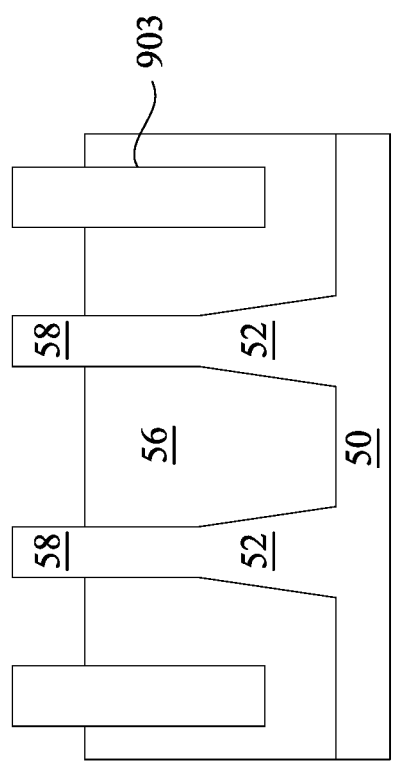

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
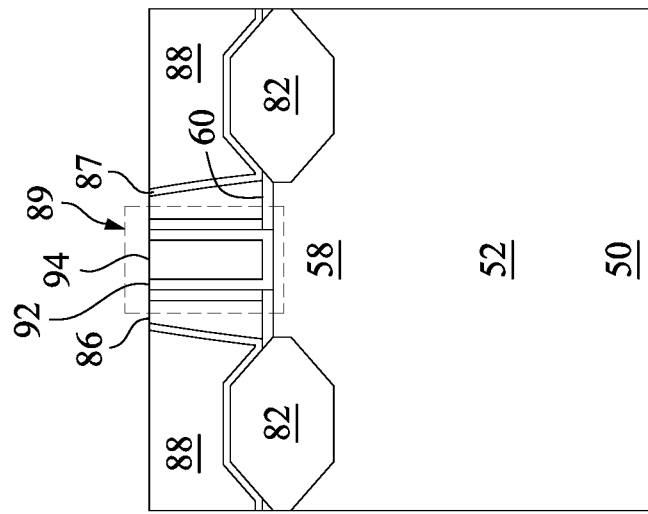
Figure 20A:
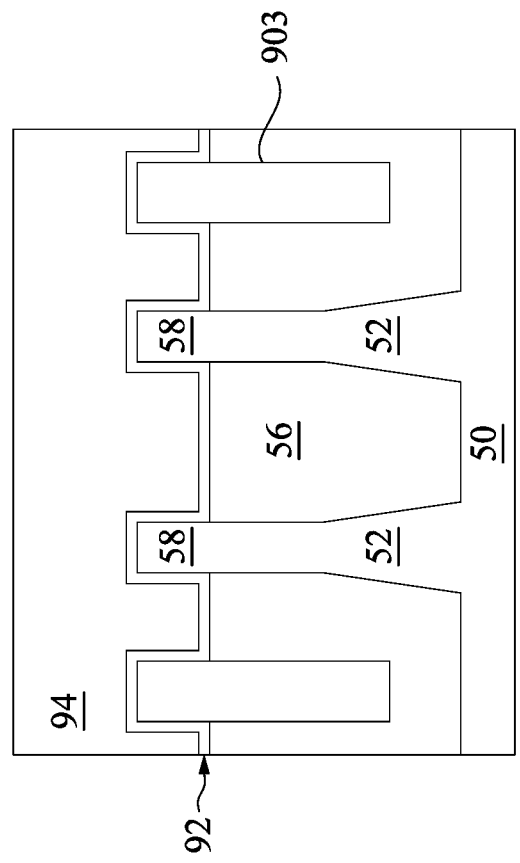
Figure 20C:
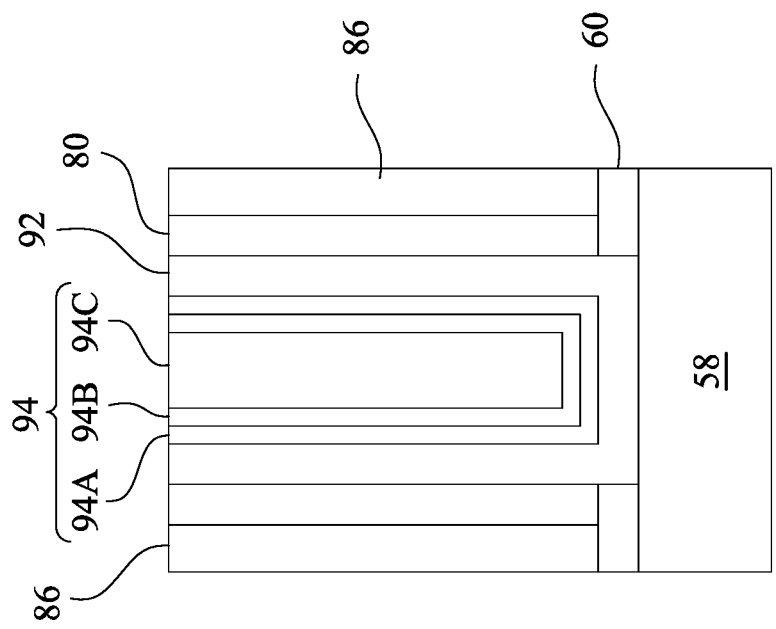

In FIGS. 20A and 20B, gate dielectric layers 92 and gate electrodes 94 are formed for replacement gates. FIG. 20C illustrates a detailed view of region 89 of FIG. 20B. Gate dielectric layers 92 may be formed on one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon dioxide, silicon nitride, metal oxide, metal silicate, or the like. For example, in some embodiments, the gate dielectric layers 92 include an interfacial layer of silicon dioxide formed by thermal or chemical oxidation and an overlying high-k dielectric material, such as a metal oxide or a silicate of hafnium, aluminum, zirconium, lanthanum, manganese, barium, titanium, lead, or combinations thereof. The gate dielectric layers 92 may include a dielectric layer having a k value greater than about 7.0. The formation methods of the gate dielectric layers 92 may include Molecular-Beam Deposition (MBD), ALD, PECVD, or the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
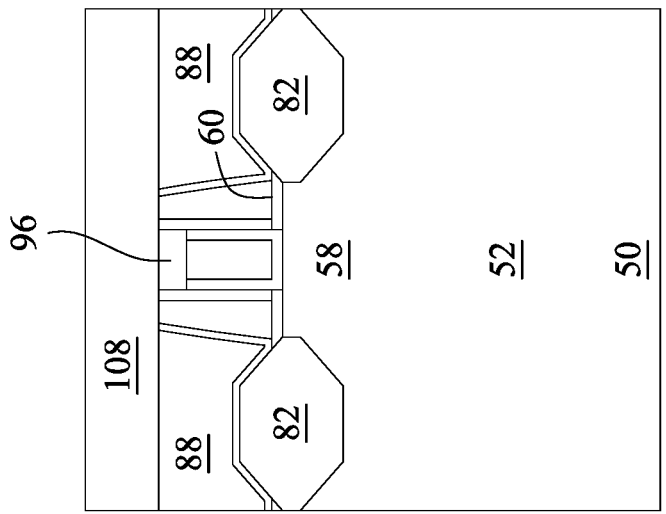
Figure 21A:
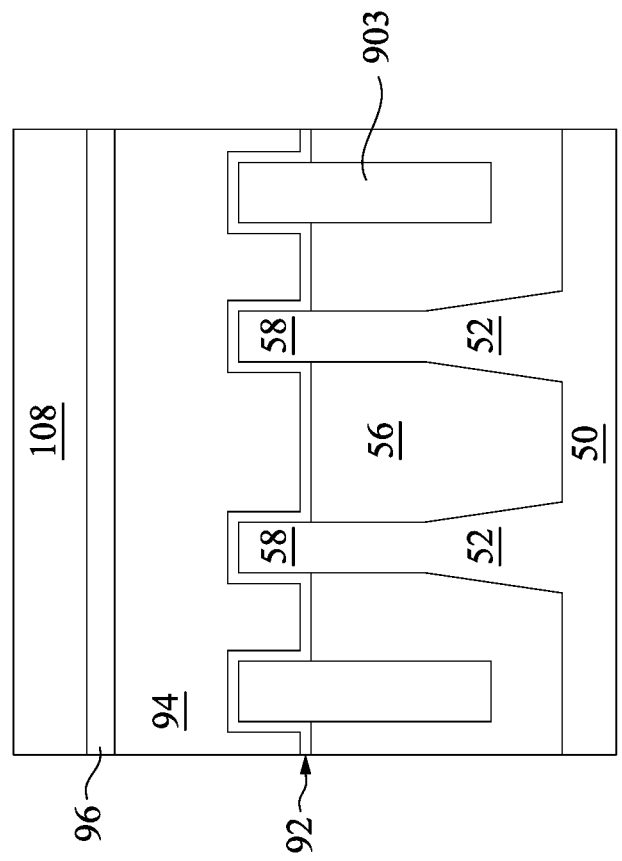

In FIGS. 21A and 21B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 22A and 22B) penetrate through the second ILD 108 and the gate mask 96 to contact the top surface of the recessed gate electrode 94.

Figure 22B:
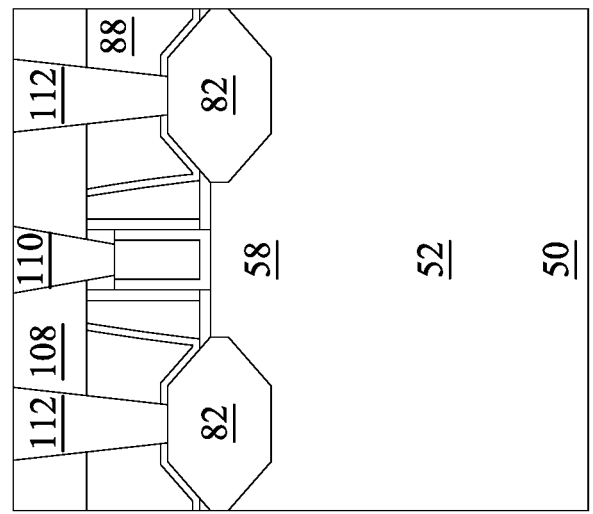
Figure 22A:
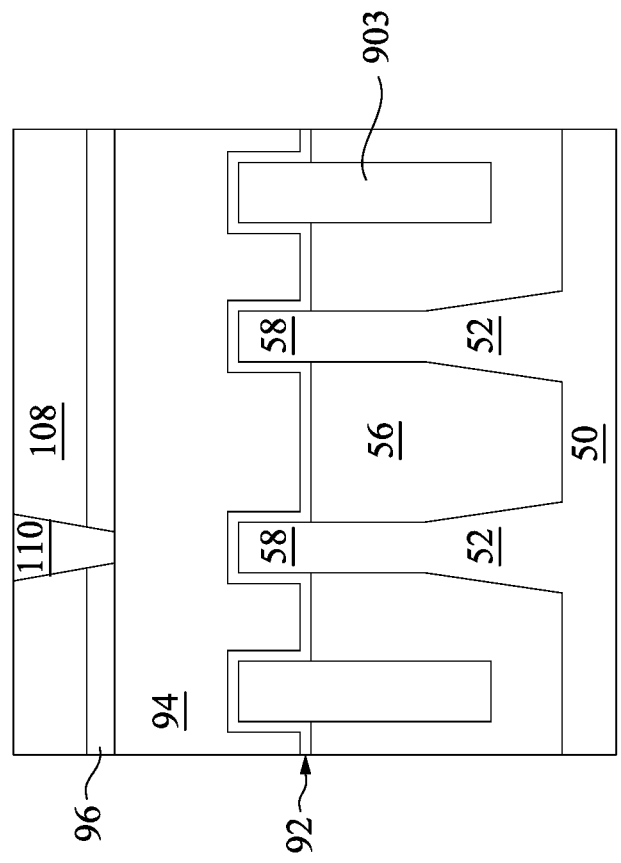

In FIGS. 22A and 22B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 23B:
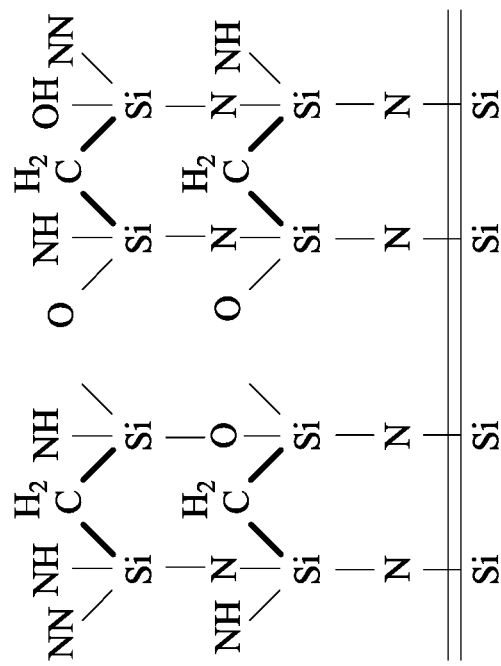
Figure 23A:
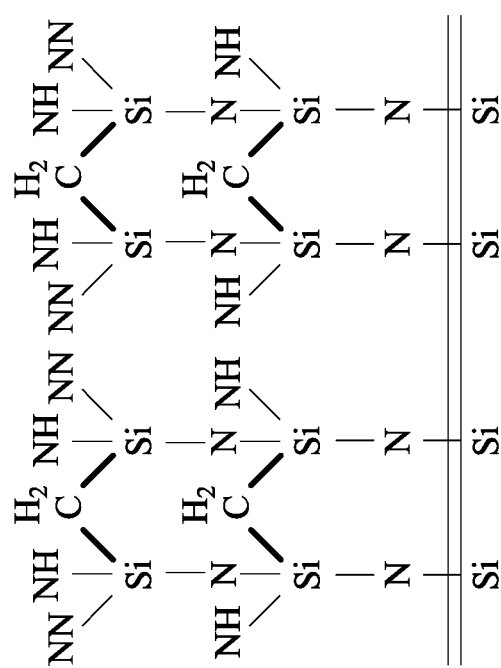

FIG. 23A illustrates an embodiment in which the capping layer 801 is initially deposited as an ammonia doped SiCN (instead of SiON as described above with respect to FIG. 8A). In this embodiment, the deposition process may use two precursors such as ammonia and trichloro[(trichlorosilyl)methyl]silane. In such an embodiment, the ammonia is pulsed in first in order to react with hydroxyl groups and replace them with nitrogen groups. After the ammonia has been pulsed, the trichloro[(trichlorosilyl)methyl]silane may be pulsed in to react with the nitrogen groups to complete a cycle. The cycle may then be repeated to build up the material of the capping layer 801, with the result of two such cycles being illustrated in FIG. 23A.

FIG. 23B illustrates the resulting structure that, once the material for the capping layer 801 in this embodiment has been deposited, the second annealing process 803 may be performed in order to transform the deposited material of the capping layer 801 (e.g., ammonia doped SiCN in this embodiment) to SiOCN, cause an expansion in the material and close any seams, and help prevent etching damage by lowering the etch rate. In this embodiment, however, the second annealing process 803 is an anneal in an oxygen containing ambient, such as a water containing ambient or an oxygen containing ambient such as oxygen in order to replace some nitrogen groups with oxygen. However, any suitable annealing process may be utilized.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

By depositing the third liner 601 as a first material (e.g., SiON), the benefits of using the first material during the deposition process, such as a reduced amount of oxidation of the underlying fin 52, may be achieved. However, by subsequently changing the first material to a second material (e.g., $SiO_2$), better stiffness and device performance can be achieved to help prevent the fins 52 from bending during subsequent processes, helping to ease the gap fill of subsequently deposited materials. Using a similar process for the deposition of the capping layer 801 may also achieve the benefits of a first material during deposition and another material during subsequent processing. As such, reduced oxidation and reduced bending of the fins 52 can be obtained, leading fewer defects and an increased ability to fill the region between the fins 52.

In accordance with an embodiment, a method of manufacturing a semiconductor device, the method including: forming a recess between a first semiconductor fin and a second semiconductor fin; depositing a first liner to line the recess, the first liner comprising a first material; annealing the first liner to transform the first material to a second material; depositing a second liner to line the recess, the second liner comprising a third material; and annealing the second liner to transform the third material to a fourth material. In an embodiment the first material comprises silicon oxynitride and the second material comprises silicon dioxide. In an embodiment the third material comprises silicon oxycarbonitride and the fourth material comprises silicon dioxide. In an embodiment the annealing the first liner includes: performing a first wet anneal at a first temperature; performing a second wet anneal at a second temperature different from the first temperature; and performing a first dry anneal. In an embodiment the annealing the second liner includes: performing a third wet anneal at a third temperature; performing a fourth wet anneal at a fourth temperature different from the third temperature; and performing a second dry anneal. In an embodiment the depositing the first liner includes: pulsing hexachlorodisilane onto the first semiconductor fin; pulsing oxygen onto the first semiconductor fin after the pulsing the hexachlorodisilane; and pulsing ammonia onto the first semiconductor fin after the pulsing the oxygen. In an embodiment the depositing the second liner includes: pulsing hexachlorodisilane onto the first semiconductor fin; pulsing triethylamine onto the first semiconductor fin after the pulsing the hexachlorodisilane; and pulsing oxygen onto the first semiconductor fin after the pulsing the triethylamine.

In accordance with another embodiment, a semiconductor device includes: a first semiconductor fin and a second semiconductor fin over a semiconductor substrate; a first liner adjacent to both the first semiconductor fin and the second semiconductor fin; a second liner over the first liner; a third liner over the second liner, the third liner comprising nitrogen at a percentage of less than about 10%; a fourth liner over the third liner; a capping layer over the fourth liner, the capping layer comprising carbon at a percentage of less than about 10%; and a dielectric cap over the capping layer, wherein the first semiconductor fin extends further away from the semiconductor substrate than the dielectric cap. In an embodiment, the capping layer has a thickness of between about 10 Å and about 70 Å. In an embodiment, the third liner has a thickness of between about 10 Å and about 50 Å. In an embodiment, the second liner comprises silicon dioxide. In an embodiment, the capping layer comprises silicon dioxide. In an embodiment, the first liner is silicon.

In accordance with yet another embodiment, a semiconductor device includes: a first semiconductor fin adjacent to a second semiconductor fin, the first semiconductor fin over a semiconductor substrate; a first isolation region extending from a first sidewall of the first semiconductor fin to a second sidewall of the second semiconductor fin, the first isolation region including: a first liner extending from the first semiconductor fin to the second semiconductor fin, the first liner comprising a first material; a second liner over the first liner, the second liner comprising a second material; a third liner over the second liner, the third liner comprising a third material, the third material have nitrogen at a percentage of less than about 10%; a fourth liner over the third liner, the fourth liner comprising a fourth material; a capping layer over the fourth liner, the capping layer comprising a capping material, the capping material comprising carbon at a percentage of less than about 10%; and a dielectric cap over the capping layer, wherein the first isolation region has a top surface closer to the semiconductor substrate than the first semiconductor fin; and a second isolation region adjacent to the first semiconductor fin, the second isolation region including: a fifth liner adjacent to the first semiconductor fin, the fifth liner comprising the first material; a sixth liner over the fifth liner, the sixth liner comprising the second material; a seventh liner over the sixth liner, the seventh liner comprising the third material; an eighth liner over the seventh liner, the eighth liner comprising the fourth material; a second capping layer over the eighth liner, the second capping layer comprising the capping material; a second dielectric cap over the second capping layer; and a dielectric fin extending into at least the second dielectric cap, a portion of the dielectric fin being planar with the first semiconductor fin, wherein there is no dielectric fin extending into the first isolation region. In an embodiment the capping layer has a thickness of between about 10 Å and about 70 Å. In an embodiment the third liner has a thickness of between about 10 Å and about 50 Å. In an embodiment the second liner comprises silicon dioxide. In an embodiment the capping layer comprises silicon dioxide. In an embodiment the first liner is silicon. In an embodiment the first semiconductor fin is separated from the second semiconductor fin by a distance of between about 5 nm and about 30 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first liner extending between a first semiconductor fin and a second semiconductor fin over a semiconductor substrate;
   a second liner in physical contact with the first liner;
   a third liner in physical contact with the second liner, the third liner comprising nitrogen at a percentage of less than about 10%;
   a fourth liner in physical contact with the third liner;
   a capping layer in physical contact with the fourth liner, the capping layer comprising carbon at a percentage of less than about 10%;
   a dielectric cap in physical contact with the capping layer, wherein the first semiconductor fin extends further away from the semiconductor substrate than the dielectric cap; and
   a dielectric fin embedded within the dielectric cap and extending further away from the semiconductor substrate than the dielectric cap.

2. The semiconductor device of claim 1, wherein the first liner is silicon.

3. The semiconductor device of claim 1, wherein the first liner has a density of between about 2 g/cm$^3$ and about 4 g/cm$^3$.

4. The semiconductor device of claim 3, wherein the first liner has a thickness of less than about 20 Å.

5. The semiconductor device of claim 1, wherein the second liner is silicon dioxide.

6. The semiconductor device of claim 5, wherein the second liner has a density of between about 2 g/cm$^3$ and about 2.6 g/cm$^3$.

7. The semiconductor device of claim 6, wherein the second liner has a thickness of between about 10 Å and about 50 Å.

8. A semiconductor device comprising:
   a first semiconductor fin and a second semiconductor fin over a semiconductor substrate;
   a first liner adjacent to both the first semiconductor fin and the second semiconductor fin;
   a second liner over the first liner;
   a third liner over the second liner, the third liner comprising nitrogen at a percentage of less than about 10%;
   a fourth liner over the third liner;
   a capping layer over the fourth liner, the capping layer comprising carbon at a percentage of less than about 10%; and
   a dielectric cap over the capping layer, wherein the first semiconductor fin extends further away from the semiconductor substrate than the dielectric cap.

9. The semiconductor device of claim 8, wherein the first liner is silicon dioxide.

10. The semiconductor device of claim 8, wherein the fourth liner is silicon dioxide.

11. The semiconductor device of claim 10, wherein the fourth liner has a thickness of between about 10 Å and about 50 Å.

12. The semiconductor device of claim 11, wherein the fourth liner has a density of between about 1.2 g/cm$^3$ and about 2.5 g/cm$^3$.

13. The semiconductor device of claim 8, wherein the capping layer is silicon oxycarbonitride.

14. The semiconductor device of claim 8, wherein the capping layer is ammonia doped silicon carbon nitride.

15. A semiconductor device comprising:
   a first semiconductor fin and a second semiconductor fin over a semiconductor substrate;
   at least four liners between the first semiconductor fin and the second semiconductor fin, wherein a first one of the at least four liners comprises nitrogen at a percentage of less than about 10% and wherein a second one of the at least four liners comprises nitrogen at a percentage of less than about 10%, the first one and the second one of the at least four liners being separated by a third one of the at least four liners;
   a capping layer over the at least four liners, the capping layer comprising carbon at a percentage of less than about 10%; and
   a dielectric cap over the capping layer, wherein the first semiconductor fin extends further away from the semiconductor substrate than the dielectric cap.

16. The semiconductor device of claim 15, wherein a first one of at least four liners is silicon nitride.

17. The semiconductor device of claim 15, wherein the capping layer has a thickness of between about 10 Å and about 70 Å.

18. The semiconductor device of claim 15, wherein the capping layer has a density of between about 2 g/cm$^3$ and about 2.6 g/cm$^3$.

19. The semiconductor device of claim 15, wherein the dielectric cap has a thickness of between about 10 Å and about 50 Å.

20. The semiconductor device of claim 15, wherein the dielectric cap has a density of between about 2 g/cm$^3$ and about 2.6 g/cm$^3$.

\* \* \* \* \*